(12) United States Patent
Zukauskas et al.

(10) Patent No.: US 9,370,072 B2
(45) Date of Patent: Jun. 14, 2016

(54) SOLID-STATE SOURCES OF LIGHT FOR PREFERENTIAL COLOUR RENDITION

(71) Applicant: VILNIUS UNIVERSITY, Vilnius (LT)

(72) Inventors: Arturas Zukauskas, Vilnius (LT); Rimantas Vaicekauskas, Vilnius (LT); Pranciskus Vitta, Vilnius (LT); Arunas Tuzikas, Vilnius (LT); Akvile Zabiliute, Vilinius (LT); Andrius Petrulis, Vilnius (LT)

(73) Assignee: VILNIUS UNIVERSITY, Vilnius (LT)

( * ) Notice: Subject to any disclaimer, the term of this patent is extended or adjusted under 35 U.S.C. 154(b) by 0 days.

(21) Appl. No.: 14/770,878

(22) PCT Filed: Feb. 28, 2013

(86) PCT No.: PCT/LT2013/000004
§ 371 (c)(1),
(2) Date: Aug. 27, 2015

(87) PCT Pub. No.: WO2014/133374
PCT Pub. Date: Sep. 4, 2014

(65) Prior Publication Data
US 2016/0007422 A1  Jan. 7, 2016

(51) Int. Cl.
*H05B 37/02* (2006.01)
*H05B 33/08* (2006.01)
*H01L 33/50* (2010.01)

(52) U.S. Cl.
CPC ............ *H05B 33/0857* (2013.01); *H01L 33/50* (2013.01)

(58) Field of Classification Search
CPC .... H05B 37/02; H05B 33/08; H05B 33/0857; H05B 33/50

USPC ......... 315/291, 294, 295, 304, 307, 308, 312, 315/363; 313/487, 498, 502, 503, 512
See application file for complete search history.

(56) References Cited

U.S. PATENT DOCUMENTS

| | | | |
|---|---|---|---|
| 5,851,063 | A | 12/1998 | Doughty et al. |
| 6,234,645 | B1 | 5/2001 | Borner et al. |
| 6,817,735 | B2 | 11/2004 | Shimizu et al. |
| 7,008,078 | B2 | 3/2006 | Shimizu et al. |
| 7,332,855 | B2 | 2/2008 | Sohn et al. |
| 7,345,418 | B2 | 3/2008 | Nagatomi et al. |
| 7,911,127 | B2 | 3/2011 | Sohn et al. |

(Continued)

FOREIGN PATENT DOCUMENTS

WO  2009/117287 A2  9/2009
WO  2013/009157 A1  1/2013

OTHER PUBLICATIONS

International Search Report, dated Nov. 25, 2013, for corresponding PCT Application.

*Primary Examiner* — Jimmy Vu
(74) *Attorney, Agent, or Firm* — Young & Thompson

(57) ABSTRACT

Polychromatic light sources of white light, which have spectral power distributions composed of at least three different components, such as clusters of colored light-emitting diodes (LEDs) or LEDs with partial or complete conversion in phosphors. Disclosed are the peak wavelengths and relative partial radiant fluxes of the spectral components that allow rendering certain fractions of an extended color palette with high fidelity and with increased chromatic saturation, respectively, and hence meeting subjective preferences to color quality of illumination.

16 Claims, 9 Drawing Sheets

(56) References Cited

U.S. PATENT DOCUMENTS

| | | |
|---|---|---|
| 7,965,031 B2 | 6/2011 | Brunner et al. |
| 7,990,045 B2 | 8/2011 | Zukauskas et al. |
| 8,017,961 B2 | 9/2011 | Kim et al. |
| 8,247,959 B2 | 8/2012 | Beers et al. |
| 9,046,227 B2 * | 6/2015 | David .................... H05B 37/02 315/291 |
| 2009/0200907 A1 | 8/2009 | Zukauskas et al. |
| 2009/0231832 A1 | 9/2009 | Zukauskas et al. |

* cited by examiner

SOLID-STATE SOURCES OF LIGHT FOR PREFERENTIAL COLOUR RENDITION

TECHNICAL FIELD

The present invention relates to polychromatic solid-state sources of white light that have spectral power distributions (SPDs) composed of at least three different spectral components, such as clusters of individually driven coloured light-emitting diodes (LEDs), which emit due to injection electroluminescence in semiconductor chips, and phosphor conversion LEDs comprising electroluminescent semiconductor chips and wavelength converters, which partially or completely convert the injection electroluminescence due to photoluminescence in phosphors. The relative partial radiant fluxes (RPRFs) of the spectral components of such light sources can be adjusted by controlling the average driving current for each LED in a cluster or by controlling the concentration and size of the phosphor particles in the converter, the size and/or shape of the converter, and the distance of the converter from the electroluminescent chip in a phosphor converted LED. Such sources can have different SPDs of white light with the same correlated colour temperature (CCT) and therefore can provide with different colour rendition quality of illumination. In particular, SPDs that allow rendering colours of illuminated surfaces with high fidelity and/or with increased or decreased chromatic saturation can be implemented. Usually, the SPDs of such sources are composed in the way that provides with the highest possible colour fidelity. On the other hand, subjects are known to exhibit preferences to lighting that makes colours appear vivid, i.e. having increased saturation. However, quantifying the ability of light to provide such preferences, establishing criteria for the subjectively preferred colour quality of illumination, and developing light sources for preferential colour rendition was difficult so far. Recently, subjective preferences to colour quality of illumination have been established by making use of solid-state sources with tunable colour rendition ability and an advanced colour rendition metric.

Embodiments of the present invention describe tetrachromatic clusters of coloured LEDs and trichromatic phosphor-converted LEDs that in comparison with a reference light source, such as a blackbody or daylight-phase illuminant, provide such colour quality of illumination that the ratio of a fraction of a large number of different test colour samples that are rendered with high fidelity to a fraction of test colour samples that are rendered with increased chromatic saturation is within a predetermined range, whereas the fraction of test colour samples that are rendered with decreased chromatic saturation is very low. Such solid-state sources of light comply with the known subjective preferences to colour quality of illumination and may find applications in many fields, such as retail, restaurant, entertainment, theatre stage, architectural, museum, surgical, etc. lighting

DEFINITIONS

LED—light emitting diode, which converts electric power to light due to injection electroluminescence within a semiconductor chip and may have an optional wavelength converter, which partially or completely converts the electroluminescence due to photoluminescence in phosphors.

LER—luminous efficacy of radiation, which measures the ability of radiation to produce a visual sensation in lm/W.

Colour space—a model for the mathematical representation of a set of colours.

Munsell samples—a set of colour samples introduced by Munsell and then updated, such that each sample is characterized by hue, value (lightness scale), and chroma (colour purity/saturation scale).

Colour rendered with high fidelity—the colour of a test colour sample, which, when a reference light source is replaced by a source under test, has a chromaticity shift residing within a region on a chromaticity diagram, which contain all colours that are indistinguishable, to the average human eye, from a colour at a centre of the region.

Colour rendered with increased saturation—the colour of a test colour sample, which, when a reference light source is replaced by a source under test, has a chromaticity shift stretching out of a region on a chromaticity diagram, which contain all colours that are indistinguishable, to the average human eye, from a colour at a centre of the region, in the direction of increased chroma.

Colour rendered with decreased saturation—the colour of a test colour sample, which, when a reference light source is replaced by a source under test, has a chromaticity shift stretching out of a region on a chromaticity diagram, which contain all colours that are indistinguishable, to the average human eye, from a colour at a centre of the region, in the direction of decreased chroma.

MacAdams ellipses—the regions on the chromaticity plane of a colour space that contain all colours which are almost indistinguishable, to the average human eye, from the colour at the centre of the region.

Group—one or more (i.e. at least one), unless otherwise noted.

BACKGROUND ART

White light can be composed of coloured components using the principle of colour mixing, which relies on three colour-mixing equations. The colour mixing principle implies that for compositions containing only two coloured components, such as blue and yellow or red and blue-green, white light with a predetermined CCT can be obtained when the coloured components complement each other, i.e. both their chromaticity and RPRFs are exactly matched in a particular way. A set of three coloured components, such as red, green, and blue, can be used for composing white light with different CCTs and different colour rendition characteristics depending on the selection of the SPDs and RPRFs of each component. When four or more appropriate coloured components are employed, the three colour mixing equations yield no single solution for a predetermined chromaticity of white light, i.e. white light of the same chromaticity can be obtained within an infinite number of SPDs containing blends of coloured components with various RPRFs. This implies that for a particular set of four and more coloured primary sources, colour rendition characteristics of white light can be varied.

Tailoring the SPD of white light within a single lamp became very convenient with the development of solid-state lighting technology based on LEDs. LEDs are available with many colours, have small dimensions, and their principle of operation allows varying the output flux by driving current. Direct emission LEDs employ the principle of injection electroluminescence, which yields narrow-band emission with the spectral peak position controlled by varying the chemical contents and thickness of the light-generating (active) layers. Phosphor converted LEDs employ partial or complete conversion of electroluminescence to other wavelengths. The latter LEDs are used for the generation of both wide-band coloured emission and white light within a single package. In white phosphor conversion LEDs, the RPRFs of the coloured components are set by adjusting the concentration and size of the phosphor particles in the converter, the size and/or shape of the converter, and the distance of the converter from the electroluminescent chip. Another method of generating white is assembling LED packages with different chromaticity into clusters and using electronic circuits for the control of the partial fluxes of each group of emitters and using optical means for the uniform distribution of the colour-mixed emission. Both methods allow for the development of sources of light with predetermined or dynamically controlled colour rendition properties.

Such versatility in tailoring the colour rendition properties of illumination has been considered in numerous patents and publications of prior art. In the case of the clusters of coloured LEDs, tetrachormatic systems, which have a degree of freedom for tailoring colour rendition properties of white light within a particular set of primary emitters, have been widely considered. However, the proposed SPDs depend on the colour rendition metric used. For instance, D. A. Doughty et al. (U.S. Pat. No. 5,851,063, 1998) proposed a source of light composed of 4 groups of coloured LEDs with the wavelengths of the LEDs selected such that the general colour rendering index ($R_a$), which is defined by the International Commission of Illumination (Commission Internationale de l'Éclairage, CIE) using 8 test colour samples (CIE Publication No. 13.3, 1995), is at least approximately 80 or 85. H. F. Börner et al. (U.S. Pat. No. 6,234,645, 2001) disclosed a lighting system composed of four LEDs with the luminous efficacy and $R_a$ having magnitudes in excess of predetermined values. In the subsequent journal publications, the trade-offs between LER and $R_a$, as well as the corresponding optimal wavelengths of LEDs for tetrachromatic and pentachromatic sources of light were established (A. Zukauskas et al., Appl. Phys. Lett., 80, 234, 2002). M. Shimizu et al. (U.S. Pat. No. 6,817,735, 2004 and U.S. Pat. No. 7,008,078, 2006) disclosed tetrachromatic solid-state sources of white light with $R_a$ of at least 90 and with improved colour saturating ability, which was quantified as the gamut area of chromaticities of four CIE standard test colour samples. Later, polychromatic LED clusters have been optimized using an improved metric for the assessment of colour rendition properties of light sources, Colour Quality Scale (CQS; W. Davis and Y. Ohno, Proc. SPIE 5941, 59411G, 2005; W. Davis and Y. Ohno, Opt. Eng. 49, 033602, 2010), which relies on 15 test colour samples and an improved colour space and quantifies the colour rendition properties in terms of the general CQS, which does not penalize colour distortions due to increased chromatic saturation, and additional scales for colour fidelity, gamut area, and preference. W. W. Beer and G. R. Allen disclosed illumination systems composed of a plurality of organic and inorganic emitters and having an average increase of chroma for the 15 CQS test colour samples (U.S. Pat. No. 8,247,959, 2012).

The CRI metric with a small number of test colour samples was also used for the optimization of colour rendition properties of phosphor converted LEDs. For instance, trichromatic phosphor blends for white LEDs with the complete conversion of near-UV electroluminescence were disclosed by J. R. Sohn et al. ($R_a$>75; U.S. Pat. No. 7,332,855, 2008) and A. Nagatomi et al. ($R_a$>80; U.S. Pat. No. 7,345,418, 2008). For white LEDs with the partial conversion of blue electroluminescence, dichromatic phosphor blends that provide $R_a$>90 were disclosed by J. R. Sohn et al. (U.S. Pat. No. 7,911,127, 2011), H. Brunner et al. (U.S. Pat. No. 7,965,031, 2011), and K. N. Kim et al. (U.S. Pat. No. 8,017,961, 2011).

However, the above approaches to the optimization of solid-state sources of white light containing multiple coloured components are far from exploiting the advantages of solid-state lighting in the versatility of colour quality to a full extent. Most approaches rely on colour rendition metrics that use a small number of test colour samples (8-15) and assess either solely colour fidelity characteristics of white light ($R_a$) or integrate high fidelity and colour saturating ability (CQS). Moreover, the general CRI has been found to contradict visual ranking of solid-state sources of light (CIE Publication No. 177, 2007), whereas the CQS metric still suffers from a small number of test colour samples of very similar chroma and from the lack of psychophysical validation.

An advanced approach to assessing colour quality of light sources, which distinguishes between different colour rendition characteristics with high confidence, is based on analyzing colour shift vectors for any number of different test colour samples (A. Zukauskas et al., IEEE J. Sel. Top. Quantum Electron. 15, 1753, 2009; A. Zukauskas et al., J. Phys. D Appl. Phys. 43, 354006, 2010). The samples are computationally sorted to several groups depending on a type of the colour distortion that occurs when the reference source is replaced by that under assessment. The type of colour distortion is evaluated depending on the behaviour of the colour shift vector in respect of experimentally established just perceived differences of chromaticity and luminance. Then the relative numbers (percentages) of test colour samples that exhibit colour distortions of various types are defined as statistical colour quality indices: Colour Fidelity Index (CFI; percentage of the test colour samples having the colour shifts smaller than perceived chromaticity differences), Colour Saturation Index (CSI; percentage of the test colour samples having the colour shift vectors with a perceivable increase in chromatic saturation), Colour Dulling Index (CDI; percentage of the test colour samples having the colour shift vectors with a perceivable decrease in chromatic saturation), Hue Distortion Index (HDI; percentage of the test colour samples having the colour shift vectors with a perceivable distortion of hue), and Lightness Distortion Index (LDI; percentage of the test colour samples having the colour shift vectors with a perceivable distortion of lightness).

The statistical approach has been employed for the maximization of CFI of polychromatic white lamps composed of coloured LEDs (A. Zukauskas et al., U.S. Patent Appl. No 2009/0200907) as well as of white LEDs with both partial and complete conversion in phosphors (A. Zukauskas et al., U.S. Pat. No. 7,990,045, 2011 and A. Zukauskas et al., U.S. Patent Appl. No 2009/0231832, respectively). The same approach has been used for establishing the principle design rules for LED-based lamps with maximized CSI (A. Zukauskas et al., Opt. Express 18, 2287, 2010) and maximized CDI (A. Zukauskas et al., Opt. Express 20, 9755, 2012). A colour rendition engine, based on a tetrachromatic tunable SPD, which is a weighted sum of the SPD of a high-CSI (colour-saturating) trichromatic red-green-blue (RGB) LED cluster and the SPD of a high-CDI (colour-dulling) trichromatic amber-green-blue (AGB) LED cluster have been disclosed (A. Zukauskas et al., PCT Patent App. No WO2013009157, 2013). By varying the SPD weight parameter, the engine traverses all possible tetrachromatic (RAGB) blends, including that with the highest colour fidelity (maximal CFI). The results of the psychophysical assessment of the engine (A. Zukauskas et al., Opt. Express 20, 5356, 2012) have indicated that subjects show preferences to scenes illuminated by light that has both CSI and CFI high and of the same order (0.3≤CSI/CSI≤3) rather than to that with the highest CFI (subjectively identified as "most natural"). Such a quantification of preferential colour rendition properties of light allows for the development of solid-state sources of white light for preferential colour rendition having fixed SPDs and therefore a simplified control.

The prior art closest to the proposed solid-state sources of white light for preferential colour rendition is the aforementioned colour rendition engine disclosed in PCT Patent App. No WO2013009157, 2013. This engine requires simultaneous control of four groups coloured LEDs using a particular algorithm. Also, it features a multi-package design that can be considerably simplified by using single-package phosphor converted LEDs.

SUMMARY OF THE INVENTION

The main aim of the invention is to develop polychromatic solid-state sources of white light that meet subjective preferences to colour quality of illumination. According to the best knowledge of the Applicant and inventors, prior to the disclosure of the present invention:

(a) No general approach to the optimization of the SPDs of solid-state sources of light composed of multiple spectral components have been developed for attaining the ratio of the fraction of a large number of the test colour samples that are rendered with increased saturation to the fraction of the test colour samples that are rendered with high fidelity with the values in the subjectively preferential rage of 0.3 to 3.

(b) Peak wavelength intervals for coloured LEDs comprised in clusters that meet subjective preferences to colour quality of illumination have not been established so far;

(c) Peak wavelength intervals for phosphors comprised in white LEDs with both partial and complete conversion that meet subjective preferences to colour quality of illumination have not been established so far;

(d) The RPRFs of spectral components of said LED clusters and phosphor converted LEDs have been not determined.

Main aspects of the present invention relate to polychromatic solid-state sources of white light, which have SPDs composed of at least three spectral components each component having an individual SPD and a RPRF. Such SPDs are optimized through the selection of the most appropriate SPDs and RPRFs of each component in such a way that the ratio of the statistical indices CSI and CFI has a value in the rage of 0.3 to 3 and the statistical index CDI is low. Such sources can be designed for CCTs in the range of 2000-20000 K and their colour rendition characteristics are specified in respect of reference light sources (blackbody or daylight-phase illuminants for CCTs below 5000 K and above 5000 K, respectively). The colour shift vectors are examined for over 200 test colour samples selected from the Munsell palette, comprising 1269 spectrophotmetrically calibrated samples. The statistical indices are estimated by analyzing the behaviour of the colour shift vectors in respect of the 3-step MacAdam ellipses.

Embodiments of the first aspect of the invention provide solid state sources light that comprise at least one cluster of at least four groups of independently electrically driven visible-light emitters having different SPDs having peak wavelengths; an electronic circuit for the control of the average driving current of each group of emitters and/or the number of the emitters lighted on within a group; and a component for uniformly distributing radiation from the different groups of emitters over an illuminated object. More specifically, the groups of the visible-light emitters are comprised within at least one light-emitting diode package and emit light due to injection electroluminescence in semiconductor junctions or due to partial or complete conversion of injection electroluminescence in wavelength converters containing phosphors.

Embodiments of the second aspect of the invention provide solid state sources of light that comprise at least one package of at least one electrically driven light emitter and at least one wavelength converter emitting at least two spectral components with different SPDs having peak wavelengths, and a component for uniformly distributing visible radiation from the different emitters and converters over an illuminated object. More specifically, the emitters comprise LED semiconductor chips, which emit light due to injection electroluminescence in semiconductor junctions, and the wavelength converters comprise phosphors, which partially or completely convert the injection electroluminescence due to photoluminescence.

Other aspects of the invention may include electronic means for dimming the above light sources in such a way that the RPRS of each spectral component are maintained at constant values, electronic means for estimating the RPRFs of each spectral component, and computer hardware and software for the control of the electronic circuits in such a way that allows compensating thermal and aging drifts of each spectral component. The illustrative aspects of the invention are designed to solve one or more of the problems herein described.

One embodiment of the present invention describes the solid-state light source for preferential colour rendition, which is a cluster of groups of blue, cyan-green, green-yellow, and red LEDs with peak wavelengths residing within the intervals of (a) about 400-475 nm, 480-540 nm, 540-610 nm, and 610-650 nm for a CCT of 3000 K and a LER of at least of 310 lm/W; or (b) about 425-465 nm, 490-530 nm, 540-610 nm, and 610-650 nm for a CCT of 4500 K and a LER of at least of 280 lm/W; or (c) about 430-465 nm, 500-525 nm, 540-605 nm, and 610-650 nm for a CCT of 6500 K and a LER of at least of 250 lm/W;

wherein the RPRF of each group of LEDs is adjusted by controlling the average driving current for the group.

In the preferred embodiment of the coloured-LED cluster for preferential colour rendition, the cluster comprises a group of blue electroluminescent InGaN LEDs with a peak wavelength of about 453 nm, a group of green electroluminescent InGaN LEDs with a peak wavelength of about 522 nm, a group of amber phosphor converted InGaN LEDs with a peak wavelength of about 593 nm, and a group of red electroluminescent AlGaInP LEDs with a peak wavelength of about 623 nm, wherein for more than 1200 different test colour samples, the CFI, CSI, and CDI are set:

(a) to about 42%, about 42%, and about 2%, respectively, for a CCT of 3000 K, by selecting the RPRFs of 0.094, 0.265, 0.362, and 0.279 generated by said groups of 453-nm, 522-nm, 593-nm, and 623-nm LEDs, respectively; or (b) to about 42%, about 40%, and about 1%, respectively, for a CCT of 4500 K, by selecting the RPRFs of 0.193, 0.312, 0.304, and 0.191 generated by said groups of 453-nm, 522-nm, 593-nm, and 623-nm LEDs, respectively; or (c) to about 37%, about 39%, and about 1%, respectively, for a CCT of 6500 K, by selecting the RPRFs of 0.271, 0.335, 0.242, and 0.152 generated by said groups of 453-nm, 522-nm, 593-nm, and 623-nm LEDs, respectively.

Another embodiment of the present invention describes the solid-state light source for preferential colour rendition that comprises at least one package with at least one electrically driven emitter of blue light and at least one wavelength converter, within or outside the package. The semiconductor chip contained in the package emits blue light with a peak wavelength in the range of about 445-465 nm that is partially converted in a wavelength converter containing two phosphors that emit cyan light with a peak wavelength in the range of about 500-520 nm and red light with a peak wavelength in the range of about 600-620 nm, respectively, wherein the RPRF of each phosphor is set by adjusting the concentration and size of the phosphor particles in the converter, the size and/or shape of the converter, and the distance of the converter from the electroluminescent chip. A portion of the blue light is converted to cyan light using inorganic phosphors selected from the groups of compounds including but not limited to $Eu^{2+}$ activated magnesium haloorthosilicates with a general formula $(Ca,Sr,Ba)_8Mg(SiO_4)_4(Cl,F)_2$ and scandium orthosilicates with a general formula $(Ca,Sr,Ba)_8Sc_2(SiO_4)_6$; $Eu^{2+}$ activated silicon oxynitrides with a general formula $(Ca,Sr,Ba)Si_2O_2N_2$ and silicon aluminium oxynitrides with a general formula $(Ca,Sr,Ba)_3Si_{13}Al_3O_2N_{21}$; and $Mn^{2+}$ activated aluminates with general formulae $(Ca,Sr,Ba,Mg)Al_{10}O_{17}$ and $(Sc,Y,La)Al_{11}O_{18}$. Another portion of the blue light is converted to red light using inorganic phosphors selected from the groups of compounds including but not limited to $Eu^{2+}$ activated chalcogenides with a general formula $(Ca,Sr)(S,Se)$; $Eu^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$; $Eu^{2+}$ activated silicon nitrides with general formulae $(Ca,Sr,Ba)_2Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{8-x}O_x$; and $Ce^{3+}$ activated silicon nitrides with a general formula $(Ca,Sr,Ba)SiN_2$.

In the preferred embodiment of the partial conversion LED for preferential colour rendition, the package comprises a blue InGaN light-emitting semiconductor chip with a peak wavelength of about 453 nm, a cyan phosphor $Sr_3Si_{13}Al_3O_2N_{21}:Eu^{2+}$ with a peak wavelength of about 511 nm, and a red phosphor $SrS:Eu^{2+}$ with a peak wavelength of about 619 nm, wherein for more than 1200 different test colour samples, the CFI, CSI, and CDI are set:

(a) to about 33%, about 40%, and about 5%, respectively, for a CCT of 3000 K, by selecting the RPRFs of 0.046, 0.309, and 0.645 escaping from said 453-nm chip without conversion and from said 511-nm and 619-nm phosphors, respectively; or (b) to about 34%, about 44%, and about 1%, respectively, for a CCT of 4500 K, by selecting the RPRFs of 0.142, 0.434, and 0.424 escaping from said 453-nm chip without conversion and from said 511-nm and 619-nm phosphors, respectively; or (c) to about 38%, about 43%, and about 1%, respectively, for a CCT of 6500 K, by selecting the RPRFs of 0.215, 0.457, and 0.328 escaping from said 453-nm chip without conversion and from said 511-nm and 619-nm phosphors, respectively.

One more embodiment of the present invention describes the solid-state light source for preferential colour rendition that comprises at least one package with at least one electrically driven emitter of violet or near-UV light and at least one wavelength converter, within or outside the package. The semiconductor chip contained in the package emits violet or near-UV light with a peak wavelength in the range of 360-420 nm that is completely converted in a wavelength converter containing three phosphors that emit blue light with a peak wavelength in the range of 445-465 nm, cyan light with a peak wavelength in the range of 500-520 nm, and red light with a peak wavelength in the range of 600-620 nm, respectively, wherein the RPRF of each phosphor is set by adjusting the concentration and size of the phosphor particles in the converter, the size and/or shape of the converter, and the distance of the converter from the electroluminescent chip. A portion of violet or near-UV light is converted to blue light using inorganic phosphors selected from the groups of compounds including but not limited to $Eu^{2+}$ activated magnesium orthosilicates with general formulae $(Ca,Sr,Ba)MgSiO_4$, $(Ca,Sr,Ba)_3Mg(SiO_4)_2$, and $Ba_2CaMg_2Si_6O_{17}$, inosilicates with a general formula $(Ca,Sr,Ba)SiO_3$, magnesium inosilicates with a general formula $(Ca,Sr,Ba)Mg_2(SiO_3)_3$, and magnesium sorosilicates with a general formula $(Ca,Sr,Ba)MgSiO_7$; $Eu^{2+}$ activated phosphates with a general formula $(Li,K,Na)(Ca,Sr,Ba)PO_4$, magnesium phosphates with a general formula $(Li,K,Na)(Ca,Sr,Ba)_9Mg(PO_4)_7$, and halophosphates with a general formula $(Mg,Ca,Sr,Ba)_{10}(PO_4)_8(F,Cl)_2$; $Eu^{2+}$ activated borates $SrB_2O_4$ and $SrMgB_8O_{11}$; and $Eu^{2+}$ activated magnesium aluminates with general formulae $(Ba,Sr)MgAl_{10}O_{17}$, $(Ba,Sr)MgAl_{14}O_{23}$, $(Ba,Sr)Mg_2Al_{16}O_{27}$, and $(Ba,Sr)_5Mg_8Al_{55}O_{94}$. Another portion of violet or near-UV is converted to cyan light using inorganic phosphors selected from the groups of compounds including but not limited to $Eu^{2+}$ activated orthosilicates with a general formula $(Ca,Sr,Ba)_2SiO_4$, magnesium orthosilicates with a general formula $(Ca,Sr,Ba)_7Mg(SiO_4)_4$, magnesium haloorthosilicates with a general formula $(Ca,Sr,Ba)_8Mg(SiO_4)_4(Cl,F)_2$, scandium orthosilicates with a general formula $(Ca,Sr,Ba)_9Sc_2(SiO_4)_6$, inosilicates with a general formula $(Ca,Sr,Ba)SiO_3$, and strontium halosorosilicates with a general formula $(Ca,Sr,Ba)_6 Sr_4(Si_2O_7)_3(Cl,F)_2$; $Eu^{2+}$ activated orthophosphates with general formulae $(Ca,Sr,Ba)_2PO_4$ and $(K,Na)(Ca,Sr,Ba)PO_4$ and orthohalophosphates with a general formula $(K,Na)_5(Ca,Sr,Ba)_4(PO_4)_4(Cl,F)$; $Eu^{2+}$ activated lutetium borates with a general formula $(Ca,Sr,Ba)_2Lu(BO_3)_2$; $Eu^{2+}$ activated silicon oxynitrides with a general formula $(Ca,Sr,Ba)Si_2O_2N_2$, silicon aluminium oxynitrides with general formulae $(Ca,Sr,Ba)_2Si_3AlN_5O_2$ and $(Ca,Sr,Ba)_2Si_{13}Al_3O_2N_{21}$; and $Mn^{2+}$ activated gallates with general formulae $(Ca,Sr,Ba,Mg,La)Ga_{12}O_{19}$ and $(Na,K,Rb)Ga_{11}O_{17}$. The rest portion of the violet or near-UV light is converted to red light using inorganic phosphors selected from the groups of compounds including but not limited to $Eu^{2+}$ or $Mn^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$ and magnesium borates with a general formula $(Ca,Sr,Ba)_2Mg(BO_3)_2$; $Eu^{2+}$ activated silicon nitrides with general formulae $(Ca,Sr,Ba)Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{8-x}O_x$; and $Ce^{3+}$ activated silicon nitrides with a general formula $(Ca,Sr,Ba)SiN_2$.

In the preferred embodiment of the complete conversion LED for preferential colour rendition, the package comprises a near-UV InGaN light-emitting semiconductor chip with a peak wavelength of 380 nm, a blue phosphor $BaMgAl_{10}O_{17}:Eu^{2+}$ (BAM) with a peak wavelength of about 448 nm, a cyan phosphor $(Sr_{0.13}Ba_{0.87})_2SiO_4:Eu^{2+}$ with a peak wavelength of about 519 nm, and a red phosphor $Sr_2Si_5N_8:Eu^{2+}$ with a peak wavelength of about 617 nm, wherein for more than 1200 different test colour samples, the CFI, CSI, and CDI are set:

(a) to about 46%, about 33%, and about 2%, respectively, for a CCT of 3000 K, by selecting the RPRFs of 0.104, 0.256, and 0.640 escaping from said 448-nm, 519-nm and 617-nm phosphors, respectively; or (b) to about 43%, about 42%, and about 0%, respectively, for a CCT of 4500 K, by selecting the RPRFs of 0.216, 0.291, and 0.493 escaping from said 448-nm, 519-nm and 617-nm phosphors, respectively; or (c) to about 42%, about 42%, and about 0%, respectively, for a CCT of 6500 K, by selecting the RPRFs of 0.307, 0.300, and 0.393 escaping from said 448-nm, 519-nm and 617-nm phosphors, respectively.

In any of embodiments of the present invention, the light source further comprises:

an electronic circuit for dimming said light source in such a way that the RPRFs of each spectral component of said light source are maintained at constant values; and/or an electronic and/or optoelectronic circuit for estimating the RPRFs of each spectral component of said light source; and/or a computer hardware and software for the control of the electronic circuits in such a way that allows compensating thermal and aging drifts of each spectral component of said light source.

DETAILED DESCRIPTION OF THE INVENTION

Figure 1:
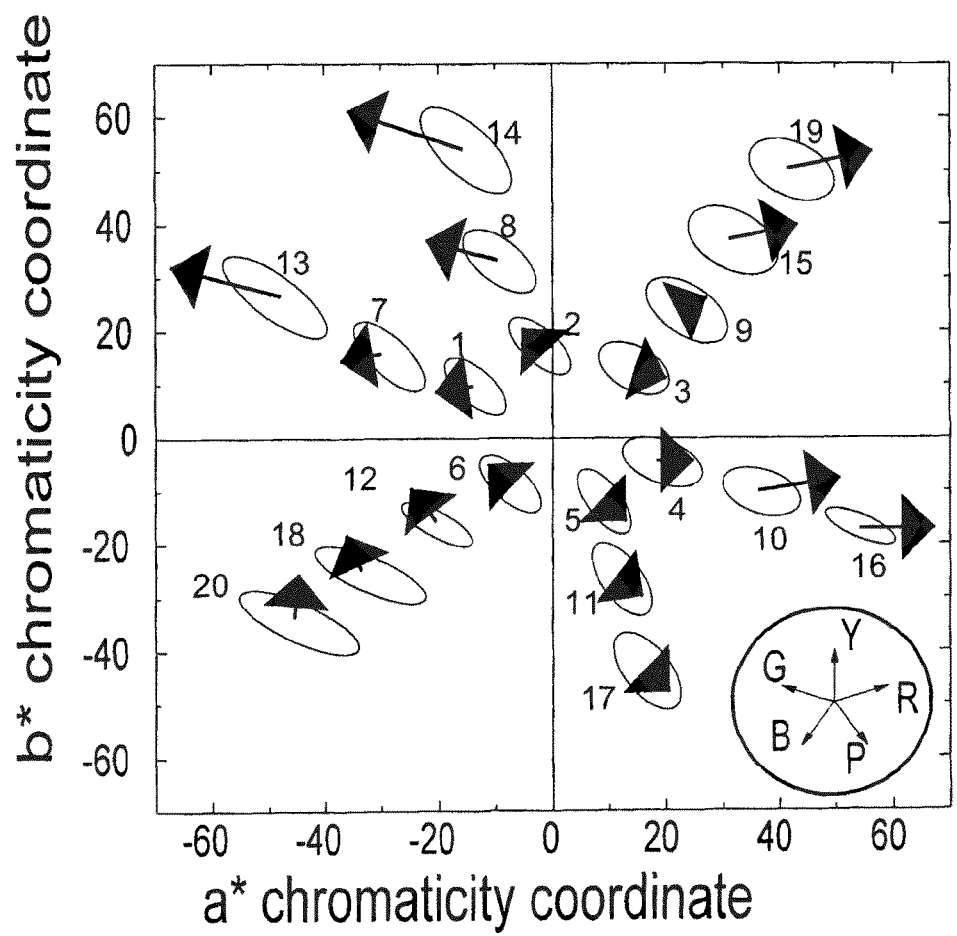
FIG. 1 shows a chromaticity diagram with 20 test colour samples represented by elliptical regions. Each elliptical region contains all the colours visually indistinguishable from a colour at the centre of the region. The vectors show colour shifts of the samples when a reference light source is replaced by a source under test.

In accordance with embodiments of the present invention, solid-state sources of white light for preferential colour rendition are provided. The sources have an SPD composed of at least three spectral components, each component having an individual SPD and an RPRF. The individual SPDs and RPRFs of the spectral components are selected such that, in comparison with a reference light source, when each of a large number (more than 15) of test colour samples resolved by an average human eye as different is illuminated, the colour rendition characteristics of the source derived from the colour shift vectors for the test colour samples comply with criteria for the subjectively preferred colour quality of illumination established from psychophysical experiments.

Embodiments of the present invention provide sources, having any CCT within the practical range of 2000 to 20000 K. These sources have composite SPDs S(A) composed of SPDs of n components $S_i(\lambda)$ (n>3). For both composite and component SPDs normalized in power, $$S(\lambda) = \sum_{i=1}^{n} c_i S_i(\lambda), \qquad (1)$$

where $c_i$ are the RPRFs of the n components.

The RPRFs of the components can be found from the three equations that follow from the principle of additive colour mixing [G. Wyszecki and W. S. Stiles, *Color Science: Concepts and Methods, Quantitative Data and Formulae*. Wiley, New York, 2000]:

$$\begin{cases} \sum_{i=1}^{n} c_i X_i = x_T \sum_{i=1}^{n} c_i (X_i + Y_i + Z_i), \\ \sum_{i=1}^{n} c_i Y_i = y_T \sum_{i=1}^{n} c_i (X_i + Y_i + Z_i), \\ \sum_{i=1}^{n} c_i = 1, \end{cases} \quad (2)$$

where $x_T$ and $y_T$ are the CIE 1931 chromaticity coordinates of the composite source and $X_i$, $Y_i$, and $Z_i$ are the tristimulus values of the normalized SPD of the i-th component.

Embodiments of the present invention provide sources of white light that are compared in colour rendition properties to reference sources having the same CCT. The reference sources are either blackbody illuminants (for CCTs below 5000 K) or daylight-phase illuminants (for CCTs above 5000 K).

In order to characterize the colour rendition properties of white light, aspects of the present invention use different colour rendition characteristics of a light source related to the distortions of colours that occur when a reference source of light is replaced by the source provided by embodiments of the present invention. These distortions of colours are analysed for a large number of illuminated test colour samples. Aspects of the present invention are based on an advanced procedure for the assessment colour-rendition properties. A common approach for the assessment of the colour-rendition characteristics of a light source is based on the estimation of colour differences (e.g. shifts of the colour coordinates in an appropriate colour space) for test colour samples when a reference source (e.g. blackbody or extrapolated daylight-phase illuminant) is replaced by the source under consideration. The standard CIE 1995 procedure, which initially was developed for the rating of halophosphate fluorescent lamps with relatively wide spectral bands, and which was later refined and extended, employs only eight to fourteen test samples from the vast palette of colours originated by the artist A. H. Munsell in 1905. When applied to sources composed of narrow-band emitters, such as LEDs, the CIE 1995 procedure receives criticism that is first due to the small number of test samples (eight to fourteen) employed. Other drawbacks are the use of colour shifts in the colour space, which lacks uniformity in terms of perceived colour differences, and the disregard of the shift directions, i.e. only colour fidelity is estimated. An improved approach, the Colour Quality Scale mitigates the latter drawbacks by using a more uniform colour space and either negating the components of the shifts that represent increased colour saturation of the samples or using Colour Preference Scale and Gamut Area Scale, which take such shifts into account. However the number of test colour samples (15) used in the CQS is too small to confidently distinguish between sources that render colours with high fidelity and increased/decreased chromatic saturation, because the output of such a metric depends on the set of samples used. Also, the colour preference scale of the CQS metric lacks subjective validation using psychophysical experiments.

Embodiments of the present invention are based on using a larger (and, typically, much larger) number of different test colour samples (at least 200) and on several types of colour differences that either can or cannot be distinguished by human vision for each of these samples. More specifically, the entire Munsell palette is employed, which quantifies the perceived colours in three dimensions: hue; chroma (saturation); and value (lightness). The Joensuu Spectral Database, available from the University of Joensuu Colour Group (http://spectral.joensuu.fi/), is an example of a spectrophotometrically calibrated set of 1269 Munsell samples that can be used in the practice of an embodiment of the present invention.

Aspects of the present invention avoid the use of colour spaces, which lack uniformity, in estimating the perceived colour differences (the CIELAB colour space used below for illustrating an example does not affect the results). Instead, the differences are evaluated in respect of the MacAdam ellipses, which are the experimentally determined regions in the chromaticity diagram (hue-saturation plane), containing colours that are almost indistinguishable by human vision. A nonlinear interpolation of the ellipses determined by MacAdam for 25 colours is employed to obtain the ellipses for the entire 1269-element Munsell palette. For instance, using the inverse distance weighted (geodesic) method, an ellipse centred at the chromaticity coordinates (x, y) has an interpolated parameter P(x, y) (a minor or major semiaxis or an inclination angle) given by [A. Zukauskas et al., IEEE J. Sel. Top. Quantum Electron. 15, 1753]

$$P(x, y) = \sum_{i=1}^{25} h_i^{-2} P_0(x_{0i}, y_{0i}) / \sum_{i=1}^{25} h_i^{-2}, \quad (3)$$

where $P_0(x_{0i}, y_{0i})$ is a corresponding experimental parameter, and $h_i$ is the distance from the centre of the interpolated ellipse to an original MacAdam ellipse $$h_i = \sqrt{(x-x_{0i})^2 + (y-y_{0i})^2}. \quad (4)$$

Since the MacAdam ellipses were originally defined for a constant luminance (~48 cd/m²), in embodiments of the present invention all Munsell samples are treated as having the same luminance irrespectively of their colour lightness.

In embodiments of the present invention, when a reference source is replaced by the source under consideration, a colour of a test colour sample rendered with high fidelity is defined as that with chromaticity shifted only within the 3-step MacAdam ellipse (i.e. by less than three radii of the ellipse). A colour of a test colour sample rendered with increased saturation is defined as that with the colour shift vector stretched out of the 3-step MacAdam ellipse and having a positive projection on the saturation direction larger than the size of the ellipse. Alternatively, a colour of a test colour sample rendered with decreased saturation is defined as that with the colour shift vector stretched out of the 3-step MacAdam ellipse and having a negative projection on the saturation direction larger than the size of the ellipse. Also, the test colour samples can be indentified as rendered with distorted hue, when the colour shift vector is stretched out of the 3-step MacAdam ellipse and has a projection on the hue direction larger than the size of the ellipse. In all cases, if the chromaticity of a light source does not exactly match the chromaticity of the blackbody or daylight-phase reference illuminant, chromatic adaptation is to be taken into account (e.g. in the way used in CIE Publication No. 13.3, 1995 or by W. Davis and Y. Ohno, Opt. Eng. 49, 033602, 2010). As the colour rendition characteristics for the overall assessment of a light source, aspects of the present invention use three main figures of merit that measure the relative number (percentage) of the test colour samples with colours rendered with high fidelity (Colour Fidelity Index, CSI), the relative number (percentage) of the test colour samples with colours rendered with increased chromatic saturation (Colour Saturation Index, CSI), and the relative number (percentage) of the test colour samples with colours rendered with decreased chromatic saturation (Colour Dulling Index, CDI). These three figures of merit, which are measured in percents in respect of the total number of the test Munsell samples used (e.g. 1269), are the proposed alternatives to the Colour Preference Scale and Gamut Area Scale of CQS based on 15 test samples, and other gamut area indices based on four to 15 test samples. Since CFI, CSI, and CDI are presented in the same format (statistical percentage of the same set of test colour samples) they are easy to analyze and compare. A supplementary figure of merit used in the aspects of the present invention is the relative number (percentage) of the test colour samples with colours rendered with distorted hue (Hue Distortion Index, HDI).

FIG. 1 illustrates the method of the assessment of colour rendition characteristics used in the aspects of the present invention. For simplicity, 20 3-step MacAdam ellipses are shown. The ellipses are displayed within the a*-b* chromaticity plane of the CIELAB colour space, where the white point resides at the centre of the diagram. The colour saturation (chroma) of a sample is represented by the distance of a colour point from the centre of the diagram, whereas the hue is represented by the azimuth position of the point. The arrows in FIG. 1 are the chromaticity shift vectors, which have the initial points at the centres of the ellipses, i.e. at the chromaticities of the samples illuminated by a reference source, and the senses of the vectors are at the chromaticities of the samples illuminated by a source under assessment. The insert shows the five hue directions that are close to the principle Munsell directions (red, yellow, green, blue, and purple). Within this illustration, eight different samples of 20 (2, 3, 4, 5, 6, 9, 11, and 17) are rendered with high fidelity (CFI=40%), seven samples (8, 10, 13, 14, 15, 16, and 19) are rendered with increased saturation (CSI=35%), and three different samples of 20 (12, 18, and 20) are rendered with decreased saturation (CDI=15%). The rest two samples (1 and 7) have only distorted hue; however the hue is also distorted for additional six samples having saturation distortions (8, 10, 12, 13, 14, and 16) and the overall HDI equals 40%.

In aspects of the present invention, subjective preferences to colour quality of illumination are quantified basing on the published experimental results on the psychophysical validation of the statistical metric (A. Zukauskas et al., Opt. Express 20, 5356, 2012). Such validation has been performed by allowing 100 subjects to continuously tune the colour rendition properties of a tetrachromatic source of light (colour rendition engine) and selecting the SPDs of light that, to their opinion, rendered "preferential" appearance of familiar scenes containing objects such as vegetables, fruits, and soft-drink cans of common brands. The results of the psychophysical experiment have shown that subjects show preferences to scenes illuminated by light that has both CSI and CFI high with the ratio of CSI to CFI falling within the range of 0.3 to 3 and with CDI low (<10%). It should be noted that subjects confidently distinguished between preferential lighting and high-fidelity lighting that was subjectively identified as "most natural" and had the highest values of CFI). Basing on this psychophysical experiment, embodiments of the present invention provide sources of light for preferential colour rendition, which is defined as having statistical colour rendition indices with the conditions 0.3<CSI/CFI<3 and CDI<10% held.

Owing to a larger number of test colour samples used, different procedure of assessing colour rendition characteristics of light sources, and the use of experimentally established criteria for the subjectively preferred colour quality of illumination, embodiments of the present invention provide light sources that have different SPDs than those disclosed in the prior art.

White solid-state sources of light for preferential colour rendition, having CCT within the range of 2000 to 20000 K, with the SPD composed of at least three spectral components with individual SPDs and RPRFs selected such that for the statistical colour rendition indexes assessed using more than 200 test colour samples, the conditions 0.3<CSI/CFI<3 and CDI<10% are held, are provided in the embodiments of the present invention within several aspects. These aspects differ in the principle of setting the RPRFs of the coloured components. More specifically, the aspects of the present invention cover clusters of independently driven different coloured LEDs, wherein the RPRFs are set by controlling the average driving current of each group of emitters, and LEDs with partial or complete conversion of the short-wavelength radiation in phosphor converters, wherein the RPRFs are set by adjusting the concentration and size of the phosphor particles in the converter, the size and/or shape of the converter, and the distance of the converter from the electroluminescent chip.

One aspect of the present invention describes a light source, having a predetermined CCT, comprising at least one cluster of at least four groups (n≥4) of independently electrically driven visible-light emitters having different SPDs having peak wavelengths; an electronic circuit for the control of the average driving current of each group of emitters and/or the number of the emitters lighted on within a group; and a component for uniformly distributing radiation from the different groups of emitters over an illuminated object. More specifically, such light source comprises at least one package comprising independently driven visible-light emitters, which emit light due to injection electroluminescence in semiconductor junctions or due to partial or complete conversion of injection electroluminescence in wavelength converters containing phosphors.

Light sources provided by the first aspect of the invention may contain independently driven groups of coloured emitters operating in both the electroluminescent and photoluminescent modes and fabricated of different materials. This results in the diversity of the component SPD profiles, which, in combination with the fact that the number of colour components (n≥4) exceeds the number of colour-mixing equations (3), allows for no general solution for the optimal peak wavelengths and RPRFs of sources of light with predetermined colour rendition properties. In order to resolve this issue, embodiments of the first aspect of the present invention employ a simplified two-step procedure for finding the SPDs of solid-state sources of light for preferential colour rendition. The first step is the establishing of the approximate intervals for the peak wavelengths of the coloured components having a model SPD profile. This step can be implemented by computational searching within the 2n-dimensional parameter space of n peak wavelengths and n RPRFs constrained to 3 colour mixing equations, as well as to the required colour rendition conditions (0.3<CSI/CFI<3 and CDI<10%) and additional constraints, such as a minimal value of LER and a maximal value of HDI. The second step is the selection of practical emitters able of providing coloured components with the peak wavelengths falling within the established intervals and the finding of appropriate RPRFs of the components. This step can be implemented by computational traversing all possible metameric blends of the selected coloured components and examining their colour rendition properties. Below the two-step procedure for finding SPDs of solid-state light sources for preferential colour rendition is described in detail.

Teachings of the first aspect of the present invention can be embodied in solid-state sources of light for preferential colour rendition with SPDs containing four and more different spectral components provided by individually driven groups of emitters. However from the practical standpoint, the preferred embodiments of the first aspect of the invention are to be based on the smallest number of groups of emitters, i.e. just four. An example of the two-step procedure for finding the SPDs of such light sources with n=4 is as follows.

The approximate intervals for the peak wavelengths of the four coloured components for embodiments of the first aspect of the present invention were found for model individual SPDs having symmetrical Gaussian shape with a full width at half magnitude (FWHM) of 30 nm, which is independent of peak wavelength. Such a FWHM is an average for the SPDs of commercial visible-light LEDs with the active layers fabricated of InGaN and AlGaInP compounds (the actual SPDs of these LEDs are somewhat asymmetrical and depend on peak wavelength.) The searching within the 8-dimensional parameter space of 4 peak wavelengths and 4 RPRFs constrained to the 3 colour mixing equations, required colour rendition conditions (0.3<CSI/CFI<3 and CDI<10%), and supplementary conditions was implemented using a computer routine. The routine simulated SPDs composed of four Gaussian components with the peak wavelengths residing within the entire range of visible spectrum (380 to 780 nm) and segmented by 5-nm increments and with the RPRFs incremented by 0.0001. All simulated SPDs had the chromaticity point exactly on the CIE daylight locus or blackbody locus in order to avoid chromatic adaptation problems. The simulation was performed for three standard CCTs of 3000 K (warm white), 4500 K (cool white), and 6500 K (daylight). In order to avoid SPDs of light that severely distorts hues, a supplementary constraint (HDI≤50%) was introduced. Impractical inefficient sources were avoided by introducing supplementary restrictions on the value of LER (≥310, ≥280, and ≥250 lm/W for CCTs of 3000 K, 4500 K, and 6500 K, respectively). The statistical indices were estimated for 1269 Munsell samples.

Figure 2:
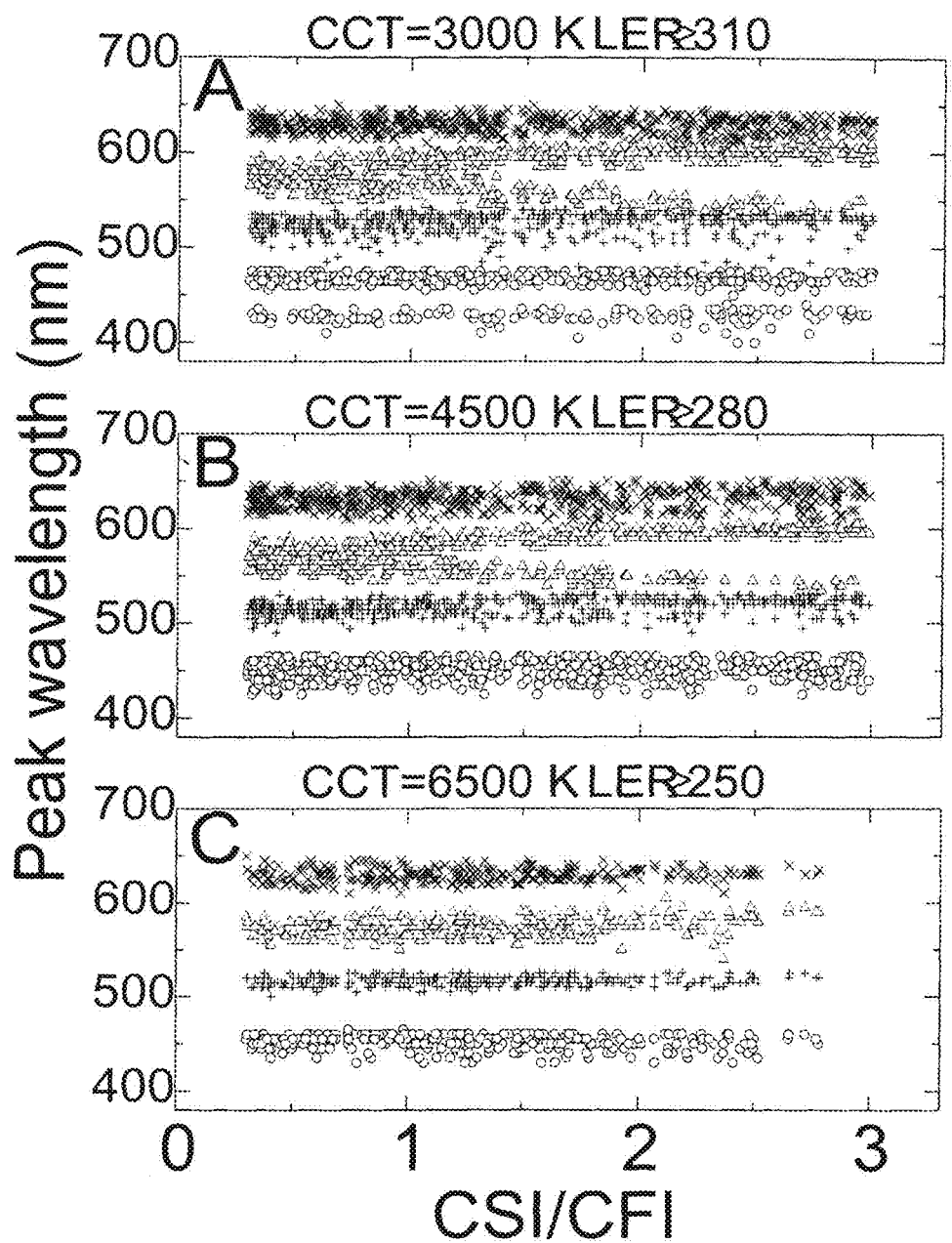
FIG. 2 display the sets of the peak wavelengths of four 30-nm wide model components comprised in the SPDs of light sources for preferential colour rendition.

FIG. 2 display the sets of the peak wavelengths of the four model components comprised in the SPDs of light sources described by the preferred embodiments (n=4) of the first aspect of the present invention. The sets are spread over the horizontal axis, which scales the CSI to CFI ratio. Parts A, B, and C of FIG. 2 display the sets of peak wavelengths for CCTs of 3000 K, 4500 K, and 6500 K, respectively. The sets of the peak wavelengths of each component are distributed within blue, cyan-green, green-yellow, and red regions of the spectrum, respectively. The results of the search presented in FIG. 2 can be used for the establishing of the approximate intervals of the peak wavelengths of the spectral components comprised in the SPDs of solid-state sources of light described by the preferred embodiments (n=4) of the first aspect of the present invention. These intervals are summarized in Table 1 for the three CCTs.

TABLE 1

| CCT (K) | $K_{min}$ (lm/W) | Wavelength intervals (nm) | | | |
|---|---|---|---|---|---|
| | | Blue | Cyan-green | Green-yellow | Red |
| 3000 | 310 | 400-475 | 480-540 | 540-610 | 610-650 |
| 4500 | 280 | 425-465 | 490-530 | 540-610 | 610-650 |
| 6500 | 250 | 430-465 | 500-525 | 540-605 | 610-650 |

Similar optimization data for embodiments of the first aspect of the present invention can be obtained for other values of CCT and minimal LER, as well as for other restrictions of HDI. Lower values of minimal LER, as well as weaker restrictions of HDI result in wider intervals of the peak wavelengths. At a constant minimal LER, the intervals are wider for lower CCTs.

From the data such as that depicted in FIG. 2 and Table 1, and other data similarly obtained in accordance with the teachings of the first aspect of the present invention, a practical solid-state light source of light for preferential colour rendition (0.3<CSI/CFI<3 and CDI<10%), can be composed of four groups of blue, cyan-green, green-yellow, and red LEDs with peak wavelengths residing within the intervals of:
  (a) about 400-475 nm, 480-540 nm, 540-610 nm, and 610-650 nm for a correlated colour temperature of 3000 K and a LER of at least of 310 lm/W; or
  (b) about 425-465 nm, 490-530 nm, 540-610 nm, and 610-650 nm for a correlated colour temperature of 4500 K and a LER of at least of 280 lm/W; or
  (c) about 430-465 nm, 500-525 nm, 540-605 nm, and 610-650 nm for a correlated colour temperature of 6500 K and a LER of at least of 250 lm/W,
wherein the partial radiant fluxes of each group of light-emitting diodes is adjusted by controlling the average driving current for each group of light-emitting diodes.

The RPRFs of the four coloured components for the preferred embodiments (n=4) of the first aspect of the present invention can be found once the practical emitters able of providing these components with the peak wavelengths falling within the established intervals are selected. Such colour components can be generated by commercially available direct-emission LEDs or coloured phosphor converted LEDs, constituting practical clusters for preferential colour rendition. The individual SPDs of the LEDs can be characterized by a peak wavelength and FWHM. In embodiments of the first aspect of the present invention, the four types of LEDs with different peak wavelengths are selected within the optimal wavelength intervals presented in Table 1. Then the RPRFs for each component can be calculated for a required CSI to CFI ratio.

Figure 3:
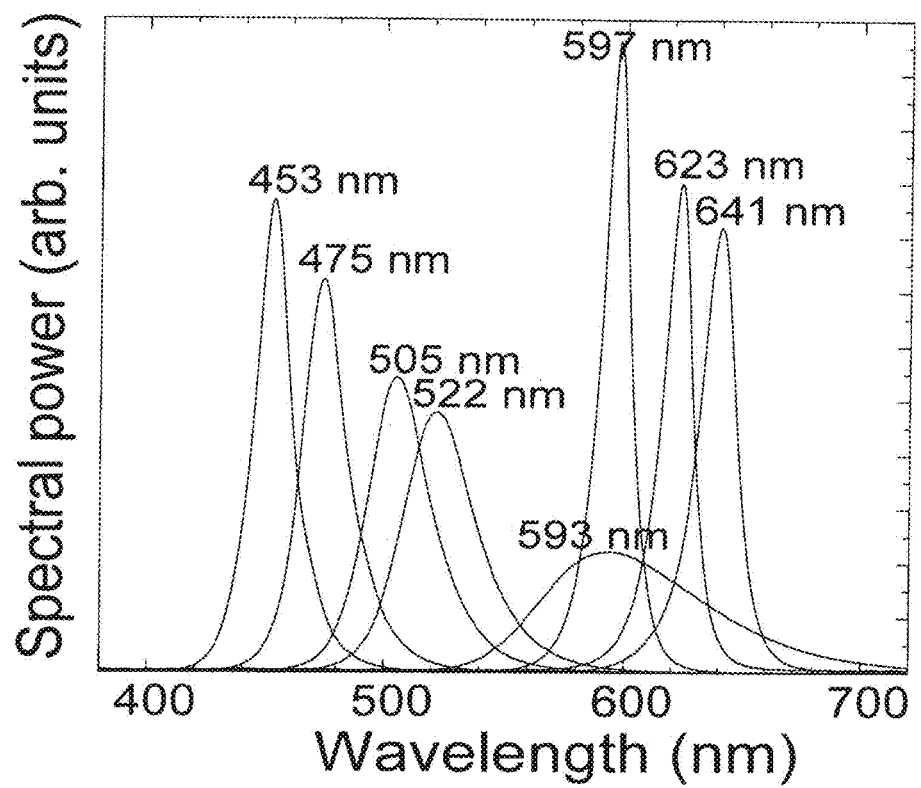
FIG. 3 shows the SPDs of eight types of practical LEDs considered in the designing of polychromatic clusters for preferential colour rendition.

FIG. 3 shows the SPDs of eight types of sample practical LEDs considered in the designing of polychromatic clusters for preferential colour rendition within the first aspect of the invention (the SPDs are normalized in power). The SPDs are typical of mass-produced commercial coloured LEDs that are available only for certain peak wavelengths that meet the needs of display and signage industries. The profile of the SPDs is seen to be somewhat different from the Gaussian one and feature asymmetry; also LEDs of different colours have different FWHMs. Herein we designate these LEDs by their peak positions and colours. The blue 453-nm and 475-nm InGaN LEDs (FWHMs of about 17 and 22 nm, respectively) are used in full-colour video displays. The cyan 505-nm and green 523-nm InGaN LEDs (FWHMs of about 31 nm and 35 nm, respectively) are used in traffic lights and video displays, respectively. The amber InGaN phosphor converted 593-nm LED (FWHM of about 80 nm) and 597-nm AlGaInP LED (FWHM of about 13 nm) are used in traffic lights and automotive signage. The red 623-nm and 641-nm AlGaInP LEDs (FWHMs of about 15 nm and 18 nm, respectively) are used in video displays and traffic lights, respectively, as well as in many kinds of signage.

In accordance with the teachings of the first aspect of the invention (FIG. 2 and Table 1), for a polychromatic LED cluster with 0.3<CSI/CFI<3 and low CDI, operating at any CCT within the range of 3000-6500 K, the four coloured emitters are to be selected from either 453-nm or 475 nm LEDs; either 505-nm or 522-nm LEDs, either 593-nm or 597 nm LEDs; and either 623-nm or 641-nm LEDs.

In embodiments of the first aspect of the present invention, the RPRFs of the four spectral components of colour-preference LED clusters are found using a method that allows traversing all possible tetrachromatic blends with a continuous variation of colour rendition characteristics. The method [A. Zukauskas et al., PCT Patent App. No WO2013009157, 2013] is based on composing tetrachromatic RAGB blends with a required CCT out of two trichromatic blends (AGB) and (RGB) having the same CCT and identical SPDs of the green and blue components. The RPRFs within trichromatic blends can be found through the solution of colour mixing equations [Eqs. (2)]. The tetrachromatic blend is composed as a weighted sum of the trichromatic blends as $$S\sigma(\lambda)=\sigma S_{RGB}(\lambda)+(1-\sigma)S_{AGB}(\lambda), \quad (5)$$

where $\sigma$ is the weight parameter, which varies in the range of 0 to 1. Such an approach implies that the RPRF of an i-th coloured emitter of the tailored source is the weighted sum of the corresponding RPRFs of the end-point AGB and RGB SPDs with the same weight parameter:

$$\Phi_{i\sigma}=\sigma\Phi_{iRGB}+(1-\sigma)\Phi_{iAGB}. \quad (6)$$

Figure 4:
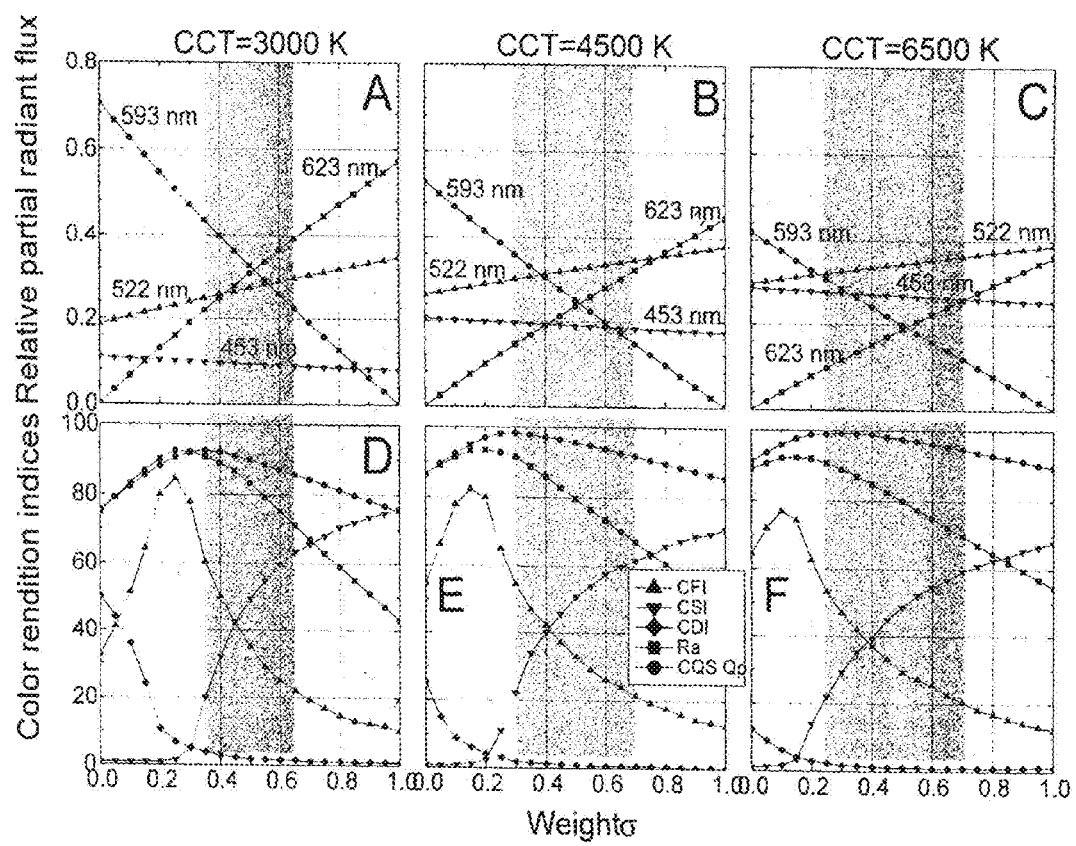
FIG. 4 illustrates the procedure of the selection of RPRFs of a tetrachromatic cluster for preferential colour rendition that is composed of practical 453-nm, 522-nm, 593-nmm and 623 nm LEDs for CCTs of 3000 K, 4500 K, and 6500 K, respectively. Parts A, B, and C display the variation of the four RPRFs with the RGB to AGB weight parameter of the RAGB SPD. Parts D, E, and F show the statistical indices CFI, CSI, and CU as functions of weight for the same three values of CCT. Also is shown the variation of $R_a$, and CQS colour preference scale. The gray areas in FIG. 4 delineate the intervals of the weight parameter, where the ratio of CSI to CFI varies from 0.3 to 3.

An example of the SPD of a solid-state source of light for preferential colour rendition obtained within the first aspect of the invention is a tetrachromatic cluster composed of practical 453-nm, 522-nm, 593-nmm and 623 nm LEDs. Parts A, B, and C of FIG. 4 display the variation of the four RPRFs with the weight parameter for CCTs of 3000 K, 4500 K, and 6500 K, respectively. The RPRF of the red component is seen to linearly decrease from the peak value to zero and the RPRF of the amber component is seen to increase from zero to the peak value as the weight increases from 0 to 1. The RPRF of the green component linearly increases with weight between the end-point values, whereas the RPRF of the blue component shows a small decrease with weight. With increasing CCT, the RPRFs of the red and amber components decrease, whereas those of the green and blue component increase. Parts D, E, and F of FIG. 4 show the statistical indices CFI, CSI, and CDI as functions of weight for the same three values of CCT. Also is shown the variation of $R_a$, and CQS colour preference scale $Q_p$. The CFI attains peak values of 84%, 82%, and 77% at weights of 0.25, 0.15, and 0.10 for CCTs of 3000 K, 4500 K, and 6500 K, respectively. The highest values of CDI and CSI are attained at the end-points of $\sigma=0$ and $\sigma=1$, respectively. At $\sigma=1$, CSI equals 76%, 71%, and 68% for CCTs of 3000 K, 4500 K, and 6500 K, respectively. The gray areas in FIG. 4 delineate the intervals of the weight parameter, where the ratio of CSI to CFI varies from 0.3 to 3. These areas correspond to the highest rates of subjective selection of preferential colour quality as follows from the psychophysical experiments [A. Zukauskas et al., Opt. Express 20, 5356, 2012]. Note that within the preferential range, the tetrachromatic blends have moderate colour fidelity (less than the peak CFI and $R_a$) and have very low values of CDI. The dependence of CQS $Q_p$ on the weight parameter is seen to have peaks on the boundary the preferential range. This means that embodiments of the first aspect of the present invention provide light sources that have colour rendition characteristics different from those disclosed in the previous art, wherein such indices as CFI, $R_a$ or CQS $Q_p$ were maximized.

Examples of SPDs that can be used in embodiments of the first aspect of the present invention were simulated for the blue, green, amber, and red components of the SPDs provided by the 453-nm, 522-nm, 593-nmm and 623 nm LEDs. Table 2 presents the numerical data on the parameters of the sample SPDs (CSI, CFI, CDI, CS/CFI, LER, $R_a$, and RPRFs) for CCTs of 3000 K, 4500 K. and 6500 K. These SPDs were obtained within the first aspect of the invention, when the peak wavelength of each spectral component was selected from the intervals obtained through computational searching within the 8-dimensional parametric space (Table 1) and RPRFs were established using the above described traversing of the tetrachromatic blends.

TABLE 2

| CCT | CFI | CSI | CDI | CSI/ CFI | LER | CQS | | Relative partial radiant flux | | | |
|---|---|---|---|---|---|---|---|---|---|---|---|
| (K) | (%) | (%) | (%) | | (lm/W) | $R_a$ | $Q_p$ | 453 nm | 522 nm | 593 nm | 623 nm |
| 3000 | 60 | 20 | 4 | 0.33 | 333 | 91 | 92 | 0.097 | 0.249 | 0.434 | 0.220 |
|  | 42 | 42 | 2 | 1.02 | 328 | 87 | 91 | 0.094 | 0.265 | 0.362 | 0.279 |
|  | 22 | 63 | 1 | 2.85 | 318 | 71 | 86 | 0.088 | 0.297 | 0.224 | 0.392 |
| 4500 | 55 | 22 | 2 | 0.41 | 317 | 91 | 98 | 0.196 | 0.300 | 0.359 | 0.145 |
|  | 42 | 40 | 1 | 0.95 | 313 | 86 | 97 | 0.193 | 0.312 | 0.304 | 0.191 |
|  | 22 | 62 | 1 | 2.87 | 303 | 67 | 92 | 0.183 | 0.346 | 0.147 | 0.323 |
| 6500 | 53 | 22 | 2 | 0.42 | 300 | 91 | 99 | 0.276 | 0.321 | 0.307 | 0.096 |
|  | 37 | 39 | 1 | 1.06 | 296 | 85 | 99 | 0.271 | 0.335 | 0.242 | 0.152 |
|  | 20 | 59 | 1 | 2.90 | 288 | 70 | 95 | 0.261 | 0.362 | 0.118 | 0.259 |

From data such as that depicted in FIGS. 2 to 4, Tables 1 and 2, and other data similarly obtained in accordance with the teachings of the first aspect of the present invention, at least four different coloured LEDs, having particular SPDs, can be composed into a polychromatic light source, having a predetermined CCT, with the colour rendition properties adjusted by selecting the RPRFs generated by each group of LEDs, in such a way that when a large set of test colour samples resolved by an average human eye as different is illuminated, the ratio of the fraction of the test colour samples that are rendered with high fidelity to the fraction of the test colour samples that are rendered with increased saturation can attain a value in the rage of 0.3 to 3 and the fraction of the test colour samples that are rendered with decreased saturation is less than 10%. The number of test colour samples within the set is preferably higher or even much higher than 15, and samples with very different hue, chroma, and value can be utilized. A source with such colour rendition properties can meet subjective preferences to colour quality of illumination despite its reduced ability to render colours of illuminated surfaces with high fidelity.

In the preferred embodiment of the first aspect of the present invention, a practical coloured-LED cluster for preferential colour rendition, comprises a group of blue electroluminescent InGaN LEDs with a peak wavelength of about 453 nm, a group of green electroluminescent InGaN LEDs with a peak wavelength of about 522 nm, a group of amber phosphor converted InGaN LEDs with a peak wavelength of about 593 nm, and a group of red electroluminescent AlGaInP LEDs with a peak wavelength of about 623 nm, wherein for more than 1200 different test colour samples, the CFI, CSI, and CDI are set (bold numbers in Table 2):

(a) to about 42%, about 42%, and about 2%, respectively, for a CCT of 3000 K, by selecting the RPRFs of 0.094, 0.265, 0.362, and 0.279 generated by said groups of 453-nm, 522-nm, 593-nm, and 623-nm LEDs, respectively; or (b) to about 42%, about 40%, and about 1%, respectively, for a CCT of 4500 K, by selecting the RPRFs of 0.193, 0.312, 0.304, and 0.191 generated by said groups of 453-nm, 522-nm, 593-nm, and 623-nm LEDs, respectively; or (c) to about 37%, about 39%, and about 1%, respectively, for a CCT of 6500 K, by selecting the RPRFs of 0.271, 0.335, 0.242, and 0.152 generated by said groups of 453-nm, 522-nm, 593-nm, and 623-nm LEDs, respectively.

Figure 5:
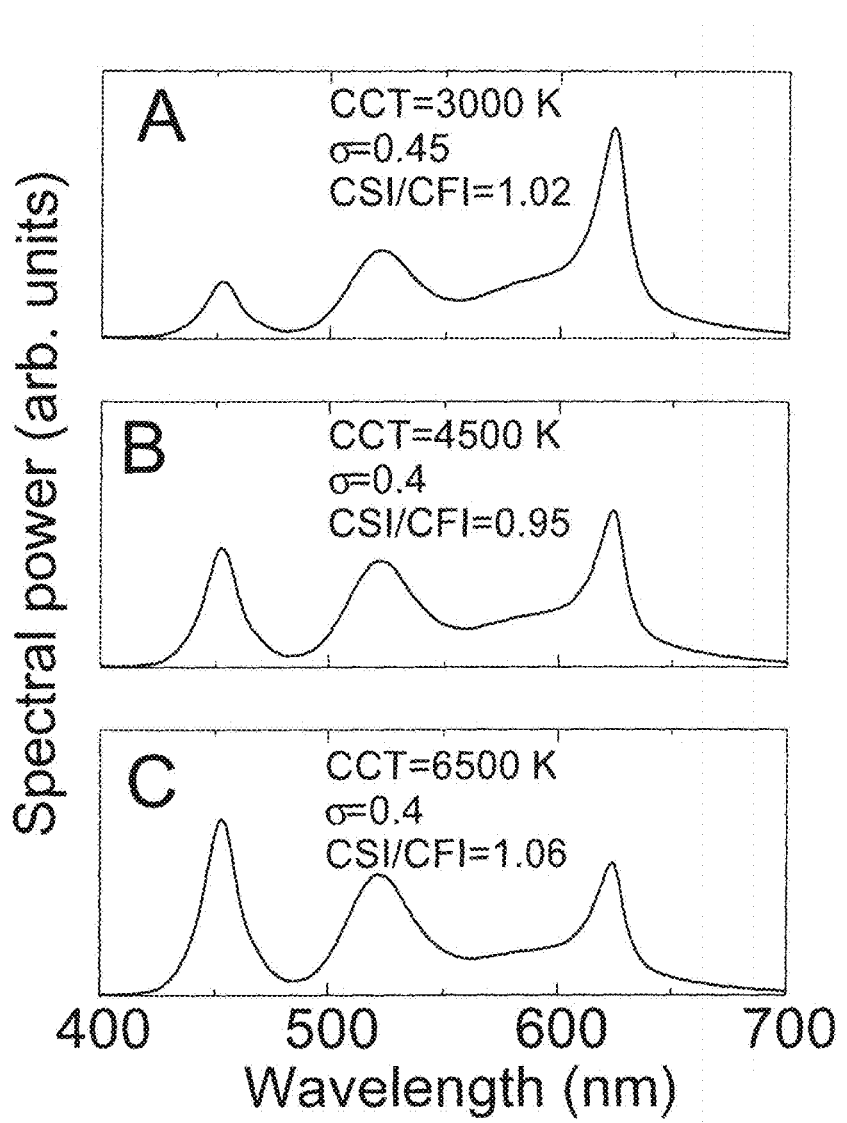
FIG. 5 displays examples of the SPDs of colour-preference clusters composed of 453-nm, 523-nm, 593-nmm and 623 nm LEDs for some values of the CSI to CFI ratio. The SPDs are shown for CCTs of 3000 K (Part A), 4500 K (Part B), and 6500 K (Part C).

FIG. 5 displays the SPDs of colour-preference LED clusters provided by the preferred embodiment of the first aspect of the present invention. The clusters are composed of the groups of blue 453-nm and green 522-nm InGaN LEDs, amber 593-nmm phosphor converted InGaN LEDs, and red 623 nm AlGaInP LEDs. The SPDs are shown for CCTs of 3000 K (Part A), 4500 K (Part B), and 6500 K (Part C). A common feature of these SPDs is a gap with reduced spectral power in the region between the green (522 nm) and red (623 nm) peaks.

Following the teachings of the first aspect of the present invention, similar coloured-LED clusters for preferential colour rendition can be composed of blue, cyan-green, green-yellow, and red LEDs with other peak wavelengths and FWHM and for other values of CCT. Also, different sets of test colour samples can be used with a number of different samples of at least 200.

The second aspect of the present invention describe light sources, having a predetermined CCT, comprising at least one package of at least one electrically driven light emitter and at least one wavelength converter, within or outside the package, emitting at least two spectral components with different SPDs having peak wavelengths, and a component for uniformly distributing visible radiation from the different emitters and converters over an illuminated object. More specifically, the electrically driven emitters of such light sources comprise LED semiconductor chips, which emit light due to injection electroluminescence in semiconductor junctions, and the wavelength converters comprise phosphors, which partially or completely convert the injection electroluminescence due to photoluminescence. The SPDs of such sources have at least three different spectral components.

The second aspect of the present invention can be embodied in two preferred modes. Embodiments of the first preferred mode of the second aspect of the invention provide solid-state sources of light for preferential colour rendition that comprise a light-emitting semiconductor chip that emits blue light that is partially converted in a wavelength converter containing two phosphors that emit light with different longer wavelengths. Embodiments of the second preferred mode of the second aspect of the invention provide solid-state sources of light for preferential colour rendition that comprise a light-emitting semiconductor chip that emits violet or near-UV light that is completely converted in a wavelength converter containing three phosphors that emit light with different longer wavelengths. In both cases, the SPDs of the sources have three different spectral components (n=3) and the RPRF of each phosphor is set by adjusting the concentration and size of the phosphor particles in the converter, the size and/or shape of the converter, and the distance of the converter from the electroluminescent chip.

Figure 6:
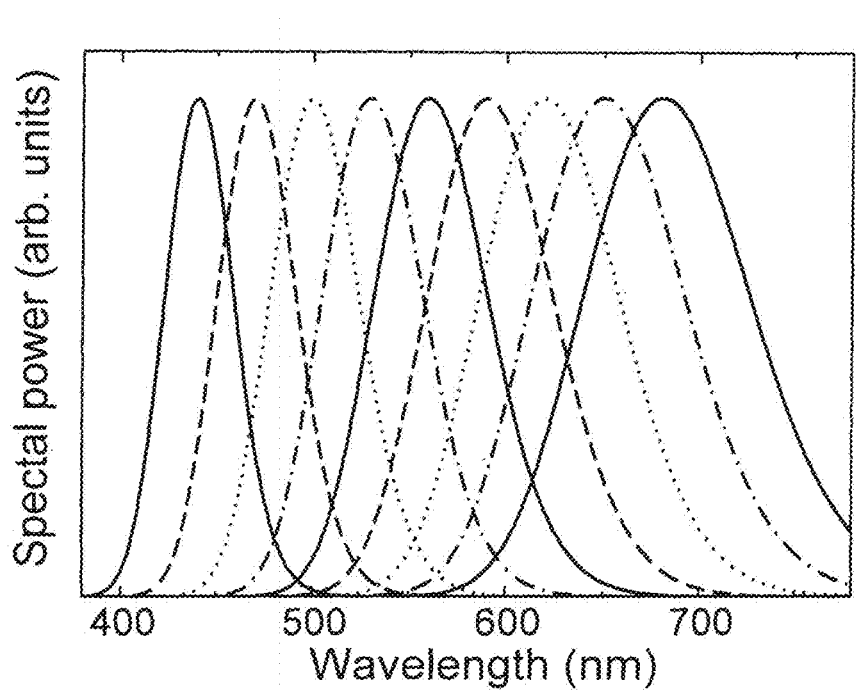
FIG. 6 shows some model SPDs of $Eu^{2+}$ containing phosphors that were used for the optimization of the SPDs of phosphor-converted solid-state light sources for preferential colour rendition.

Light sources provided by the second aspect of the invention contain electrically driven semiconductor chips emitting due to electroluminescence and phosphor converters emitting due to photoluminescence. The active layers of the semiconductor chips can be fabricated of various materials, although the preferred material is InGaN alloy. The wavelength converters can contain various phosphors and the preferred materials are inorganic compounds containing transition-metal or rear-earth ion activators. Such preferred phosphor materials that absorb blue and/or violet or near-UV light are available within a variety of chemical formulae [see, e.g. *Phosphor Handbook*, ed. By S. Shionoya and W. M. Yen. CRC Press, Boca Raton, 1999; W. M. Yen and M. J. Weber, *Inorganic Phosphors. Compositions, Preparation and Optical Properties*. CRC Press, Boca Raton, 2004; *Luminescence. From Theory to Applications*, ed. by C. Ronda. Wiley, Weinheim, 2008]. The SPDs of these phosphors may comprise spectral bands of various width and shape. However in embodiments of the second aspect of the invention, the spectral components having particular FWHMs are preferred. First, narrow-band (<10 nm) spectral components, such as provided by f-f transitions within trivalent ions of rear-earths (e.g. $Eu^{3+}$, $Pr^{3+}$, $Dy^{3+}$, $Sm^{3+}$, and $Tb^{3+}$), are avoided because of the difficulties to attain high colour fidelity characteristics of the composite SPDs. On the other hand, many wide-band spectral components, such as provided by dual overlapping f-d transitions within $Ce^{3+}$ ions are also avoided because of the difficulties to attain high colour saturation characteristics of the composite SPDs. Also, phosphors co-doped with a several types of ions and having SPDs with several distinct spectral components are not considered in the embodiments of the present invention because of the reduced versatility in the control of the composite SPD. The most appropriate phosphors for the use in the embodiments of the second aspect of the present invention are those having single spectral components of moderate FWHM, such as those provided by f-d transitions within $Eu^{2+}$ ions or d-d transitions within some $Mn^{2+}$ ions. In particular, phosphors emitting due to radiative transitions in $Eu^{2+}$ ions have rather distinct SPDs, which can be approximated by Gaussian line shapes on the photon energy scale [B. K. Ridley, *Quantum Processes in Semiconductors*. Oxford University Press, New York, 2006]. For a component SPD normalized to unity radiant power, $$S_i(hv)=2\sqrt{\ln(2)/\pi}/W_i \exp[-4\ln(2)(hv-hv_{0i})^2/W_i^2], \quad (7)$$

where $hv_{0i}$ is the peak photon energy and $W_i$ is the FWHM measured in energy units. On the wavelength scale, Eq. (7) converts to an asymmetrical spectrum $$S_i(\lambda)=k_i(\lambda/\lambda_{0i})^2 \exp[-4\ln(2)(\lambda^{-1}-\lambda_{0i}^{-1})^2/w_i^{-2}], \quad (8)$$

where $\lambda_{0i}=c/v_{0i}$ (does not exactly equal the peak position on the wavelength scale), $w_i=hc/W_i$ and $k_i$ is the normalization factor such that the integrated radiant power equals unity. The average value of FWHM, $\tilde{W}$, for most phosphors considered for application in the embodiments of the second aspect of the invention amounts about 0.27 eV, which converts to $\tilde{w}$=4591 nm. FIG. 6 shows some SPDs of $Eu^{2+}$ containing phosphors approximated by Eq. (8) with the average value of $\tilde{w}$. The FWHM of the SPDs depends on peak wavelength and, e.g. constitutes about 42 nm, 61 nm, and 93 nm for peak wavelengths of 440 nm, 530 nm, and 650 nm, respectively, which are close to those described in the literature.

In the preferred modes of the second aspect of the present invention, the number of colour components (n=3) equals the number of colour-mixing equations (3), and the SPDs of the spectral components can be approximated by model SPDs [Eq. (8)]. This allows for finding optimal peak wavelengths and RPRFs of sources of light with predetermined colour rendition properties. In embodiments of the second aspect of the present invention, the optimal SPDs of solid-state light sources for preferential colour rendition are found through the maximization of the LER of an SPD comprising three spectral components defined by Eq. (8) for each value of the CSI to CFI ratio within the range of 0.3 to 3 with the CDI maintained below 10%. Such optimization can be implemented by computational searching within the 6-dimensional parameter space of 3 peak wavelengths and 3 RPRFs constrained to 3 colour mixing equations, as well as to colour rendition conditions (0.3<CSI/CFI<3 and CDI<10%) and additional constraints, such as a maximal value of HDI. Since the number of colour components (n=3) equals the number of colour-mixing equations (3), each optimal set of the peak wavelengths of the component SPDs for a particular CCT has a single set of RPRFs.

The approximate intervals for the peak wavelengths of the three coloured components for embodiments of the second aspect of the present invention were found for model individual SPDs having shape described by Eq. (8). Such a model line shape can be also applied to blue InGaN emitters comprised in the light sources provided by the first mode of the second aspect of the present invention, since these emitters have similar FHWMs of about 20 nm (see FIG. 3). The searching within the 6-dimensional parameter space of 3 peak wavelengths and 3 RPRFs constrained to the 3 colour mixing equations, required colour rendition conditions (a CSI to CFI ratio within the range of 0.3 to 3 and CDI<10%) was implemented using a computer routine. The routine simulated SPDs composed of three different components described by Eq. (8) with the peak wavelengths residing within the entire range of visible spectrum (380 to 780 nm) and segmented by 1-nm increments and calculated their RPRFs from the colour mixing equations [(Eqs. (2)] until the highest LER was attained for a particular CSI to CFI ratio. All simulated SPDs had the chromaticity point exactly on the CIE daylight locus or blackbody locus in order to avoid chromatic adaptation problems. The simulation was performed for three standard CCTs of 3000 K (warm white), 4500 K (cool white), and 6500 K (daylight). In order to avoid SPDs of light that severely distorts hues, a supplementary constraint (HDI≤50%) was introduced. The statistical indices were estimated for 1269 Munsell samples.

Figure 7:
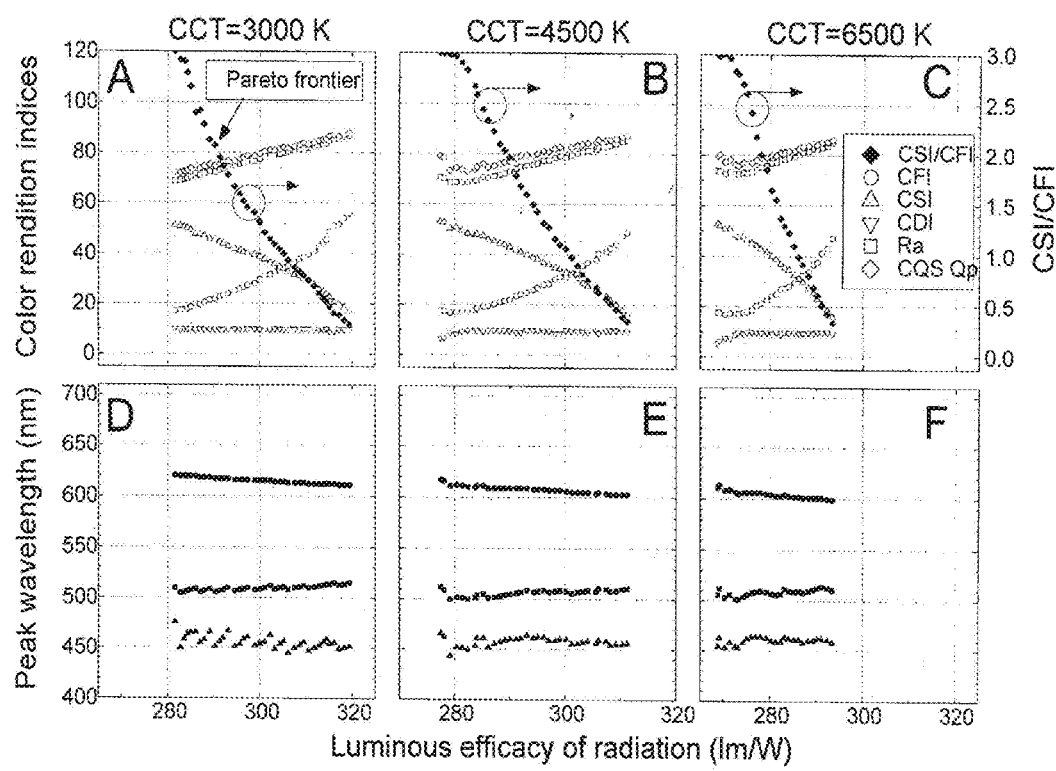
FIG. 7 display the results of the optimization of the SPDs of phosphor-converted solid-state light sources for preferential colour rendition for CCTs of 3000 K (Parts A and D), 4500 K (Parts B and E), and 6500 K (Parts C and F). Solid diamonds in Parts A, B, and C display the Pareto frontier (optimal boundary) of the distribution of the CSI to CFI ratio over LER. Also are shown the statistical indices CFI, CSI, and CDI, as well as $R_a$ and CQS $Q_p$ as functions of LER for SPDs corresponding to the Pareto frontier. Parts D, E, and F display the peak wavelengths of the component SPDs corresponding to the Pareto frontier.

FIG. 7 displays the results of the optimization of the SPDs of light sources provided by the second aspect of the present invention. Solid diamonds in Parts A, B, and C display the Pareto frontier (optimal boundary) of the distribution of the CSI to CFI ratio over LER that was obtained within the range of 0.3<CSI/CFI<3 and with additional constraints of CDI<10% and HDI≤50% for CCTs of 3000 K, 4500 K, and 6500 K, respectively. Also are shown the statistical indices CFI, CSI, and CDI, as well as $R_a$ and CQS $Q_p$ as functions of LER for SPDs corresponding to the Pareto frontier. Parts D, E, and F of FIG. 7 display the peak wavelengths of the component SPDs corresponding to the Pareto frontier. The peak wavelengths of each component are seen to vary within the blue, cyan, and red regions of the spectrum. With reducing the CSI to CFI ratio, the red component has a tendency to shift toward shorter wavelengths, the cyan component has a tendency to shift toward longer wavelengths, whereas the blue component is somewhat scattered at about constant wavelength. Also is seen that lower CCTs result in higher LERs for the same CSI to CFI ratio and in the red component somewhat shifted to longer wavelengths. The results of the optimization presented in FIG. 7 can be used for the establishing of the approximate intervals of the peak wavelengths of the spectral components comprised in the SPDs of solid-state sources of light described by the preferred embodiments (n=3) of the second aspect of the present invention. These intervals are almost the same for the three CCTs used and equal about 455-465 nm, 500-520 nm, and 600-620 nm for the blue, cyan, and red component, respectively.

Similar optimization data for embodiments of the second aspect of the present invention can be obtained for other values of CCT, as well as for other constraints on HDI value and other line shapes of the semiconductor and phosphor emitters.

From the data such as that depicted in FIG. 7 and other data similarly obtained in accordance with the teachings of the second aspect of the present invention, a practical solid-state light source of light for preferential colour rendition (0.3<CSI/CFI<3 and CDI<10%), can be composed of a light-emitting semiconductor chip emitting blue light with a peak wavelength in the range of about 445-465 nm that is partially converted in a wavelength converter containing two phosphors that emit cyan light with a peak wavelength in the range of about 500-520 nm and red light with a peak wavelength in the range of about 600-620 nm, respectively. Alternatively, a practical solid-state light source of light for preferential colour rendition (0.3<CSI/CFI<3 and CDI<10%) can be composed of a light light-emitting semiconductor chip emitting violet or near-UV light that is completely converted in a wavelength converter containing three phosphors that emit blue light with a peak wavelength in the range of about 445-465 nm, cyan light with a peak wavelength in the range of about 500-520 nm, and red light with a peak wavelength in the range of about 600-620 nm, respectively. In the latter mode, the preferred peak wavelength range of the light-emitting semiconductor chip corresponds to efficient emission of InGaN semiconductor in the range of 360-420 nm. In both modes of the second aspect of the invention, the RPRFs of each phosphor is set by adjusting the concentration and size of the phosphor particles in the converter, the size and/or shape of the converter, and the distance of the converter from the electroluminescent chip.

The RPRFs of the three coloured components for the preferred embodiments (n=3) of the second aspect of the present invention can be found once the practical emitters able of providing these components with the peak wavelengths falling within the above established intervals are selected. Such colour components can be generated by known direct-emission InGaN LED chips and available phosphors that absorb blue and/or violet or near UV light. The individual SPDs of the chips and phosphors can be characterized by a peak wavelength and FWHM.

In the embodiments of the second aspect of the present invention, the preferred phosphor materials that absorb blue and/or violet or near-UV light and emit blue, cyan, and red light within single bands of moderate FWHM are selected from the groups of inorganic compounds [see, e.g. *Phosphor Handbook*, ed. by S. Shionoya and W. M. Yen. CRC Press, Boca Raton, 1999; W. M. Yen and M. J. Weber, *Inorganic Phosphors. Compositions, Preparation and Optical Properties*. CRC Press, Boca Raton, 2004; *Luminescence. From Theory to Applications*, ed. by C. Ronda. Wiley, Weinheim, 2008]. Such groups of compounds include but are not limited to $Eu^{2+}$ doped chalcogenides, silicates, phosphates, borates, aluminates, nitrides, and oxynitrides, $Mn^{2+}$ activated chalcogenides, aluminates and gallates, and $Ce^{3+}$ activated nitrides.

More specifically, in embodiments of the first preferred mode of the second aspect of the invention, solid-state sources of light for preferential colour rendition comprise a light-emitting semiconductor chip emitting blue light with a peak wavelength in the range of about 445-465 nm that is partially converted in a wavelength converter containing two phosphors. A part of blue light is converted to cyan light with a peak wavelength in the range of about 500-520 nm using inorganic phosphors selected from the groups of compounds including but not limited to $Eu^{2+}$ activated magnesium haloorthosilicates with a general formula $(Ca,Sr,Ba)_8Mg(SiO_4)_4(Cl,F)_2$ and scandium orthosilicates with a general formula $(Ca,Sr,Ba)_9Sc_2(SiO_4)_6$; $Eu^{2+}$ activated silicon oxynitrides with a general formula $(Ca,Sr,Ba)Si_2O_2N_2$ and silicon aluminium oxynitrides with a general formula $(Ca,Sr,Ba)_3Al_3Si_{13}O_2N_{21}$; and $Mn^{2+}$ activated aluminates with general formulae $(Ca,Sr,Ba,Mg)Al_{10}O_{17}$ and $(Sc,Y,La)Al_{11}O_{18}$. Another part of blue light is converted to red light with a peak wavelength in the range of about 600-620 nm using inorganic phosphors selected from the groups of compounds including but not limited to $Eu^{2+}$ activated chalcogenides with a general formula $(Ca,Sr)(S,Se)$, $Eu^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$; $Eu^{2+}$ activated silicon nitrides with general formulae $(Ca,Sr,Ba)_2Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{8-x}O_x$; and $Ce^{3+}$ activated silicon nitrides with a general formula $(Ca,Sr,Ba)SiN_2$. One more part of blue light escapes without conversion. The partial radiant flux of each phosphor is set by adjusting the concentration and size of the phosphor particles in the converter, the size and/or shape of the converter, and the distance of the converter from the electroluminescent chip.

Examples of SPDs that can be used in embodiments of the first preferred mode of the second aspect of the invention were simulated for the blue component of the SPDs is provided by an InGaN semiconductor chip emitting light with the peak wavelength of 453 nm, the cyan component provided by either $Sr_3Si_{13}Al_3O_2N_{21}:Eu^{2+}$ or $Ca_8Mg(SiO_4)_4Cl_2:Eu^{2+}$ phosphor and the red component provided by either $Sr_2Si_5N_8:Eu^{2+}$ or $SrS:Eu^{2+}$ phosphor. Table 3 shows the parameters of the resulting four sets of emitters for standard CCTs of 3000 K, 4500 K, and 6500 K. The selected phosphors arranged into four sets are seen to provide SPDs with the CSI to CFI ratio in the range of 1.00 to 1.89 depending on a phosphor set and CCT.

TABLE 3

| CCT (K) | CFI (%) | CSI (%) | CDI (%) | CSI/CFI | LER (lm/W) | $R_a$ | CQS $Q_p$ | B* 453 nm | C1* 511 nm | C2* 513 nm | R1* 618 nm | R2* 619 nm |
|---|---|---|---|---|---|---|---|---|---|---|---|---|
| 3000 | 28 | 48 | 4 | 1.71 | 298 | 79 | 84 | 0.069 | — | 0.321 | — | 0.610 |
|  | 32 | 45 | 2 | 1.40 | 268 | 81 | 86 | 0.064 | — | 0.273 | 0.663 | — |
|  | 33 | 40 | 5 | 1.23 | 301 | 80 | 84 | 0.046 | 0.309 | — | — | 0.645 |
|  | 37 | 38 | 4 | 1.04 | 272 | 83 | 86 | 0.053 | 0.321 | — | 0.626 | — |
| 4500 | 28 | 53 | 1 | 1.89 | 288 | 79 | 90 | 0.157 | — | 0.371 | — | 0.472 |
|  | 31 | 51 | 0 | 1.66 | 265 | 80 | 91 | 0.145 | — | 0.329 | 0.526 | — |
|  | 34 | 43 | 1 | 1.27 | 291 | 83 | 90 | 0.142 | 0.434 | — | — | 0.424 |
|  | 37 | 43 | 1 | 1.14 | 270 | 84 | 92 | 0.133 | 0.389 | — | 0.478 | — |
| 6500 | 28 | 52 | 0 | 1.84 | 276 | 81 | 93 | 0.229 | — | 0.392 | — | 0.379 |
|  | 31 | 51 | 0 | 1.66 | 258 | 82 | 94 | 0.216 | — | 0.356 | 0.428 | — |
|  | 38 | 43 | 1 | 1.13 | 279 | 86 | 93 | 0.215 | 0.457 | — | — | 0.328 |
|  | 41 | 41 | 0 | 1.00 | 263 | 87 | 94 | 0.204 | 0.421 | — | 0.375 | — |

*Notations:
B is direct emission InGaN LED;
C1 is $Sr_3Si_{13}Al_3O_2N_{21}:Eu^{2+}$ phosphor;
C2 is $Ca_8Mg(SiO_4)_4Cl_2:Eu^{2+}$ phosphor;
R1 is $Sr_2Si_5N_8:Eu^{2+}$ phosphor;
R2 is $SrS:Eu^{2+}$ phosphor.

In the preferred embodiment of the first mode of the second aspect of the present invention, the solid-state light source for preferential colour rendition is a partial-conversion source that comprises a blue InGaN light-emitting semiconductor chip with a peak wavelength of about 453 nm, a cyan phosphor $Sr_3Si_{13}Al_3O_2N_{21}:Eu^{2+}$ with a peak wavelength of about 511 nm, and a red phosphor $SrS:Eu^{2+}$ with a peak wavelength of about 619 nm, wherein for more than 1200 different test colour samples, the fractions of the samples that are rendered with high fidelity, increased saturation, and decreased saturation are set (bold numbers in Table 3):

(a) to about 33%, about 40%, and about 5%, respectively, for a CCT of 3000 K, by selecting the RPRFs of 0.046, 0.309, and 0.645 escaping from said 453-nm chip without conversion and from said 511-nm and 619-nm phosphors, respectively; or (b) to about 34%, about 44%, and about 1%, respectively, for a CCT of 4500 K, by selecting the RPRFs of 0.142, 0.434, and 0.424 escaping from said 453-nm chip without conversion and from said 511-nm and 619-nm phosphors, respectively; or (c) to about 38%, about 43%, and about 1%, respectively, for a CCT of 6500 K, by selecting the RPRFs of 0.215, 0.457, and 0.328 escaping from said 453-nm chip without conversion and from said 511-nm and 619-nm phosphors, respectively.

Figure 8:
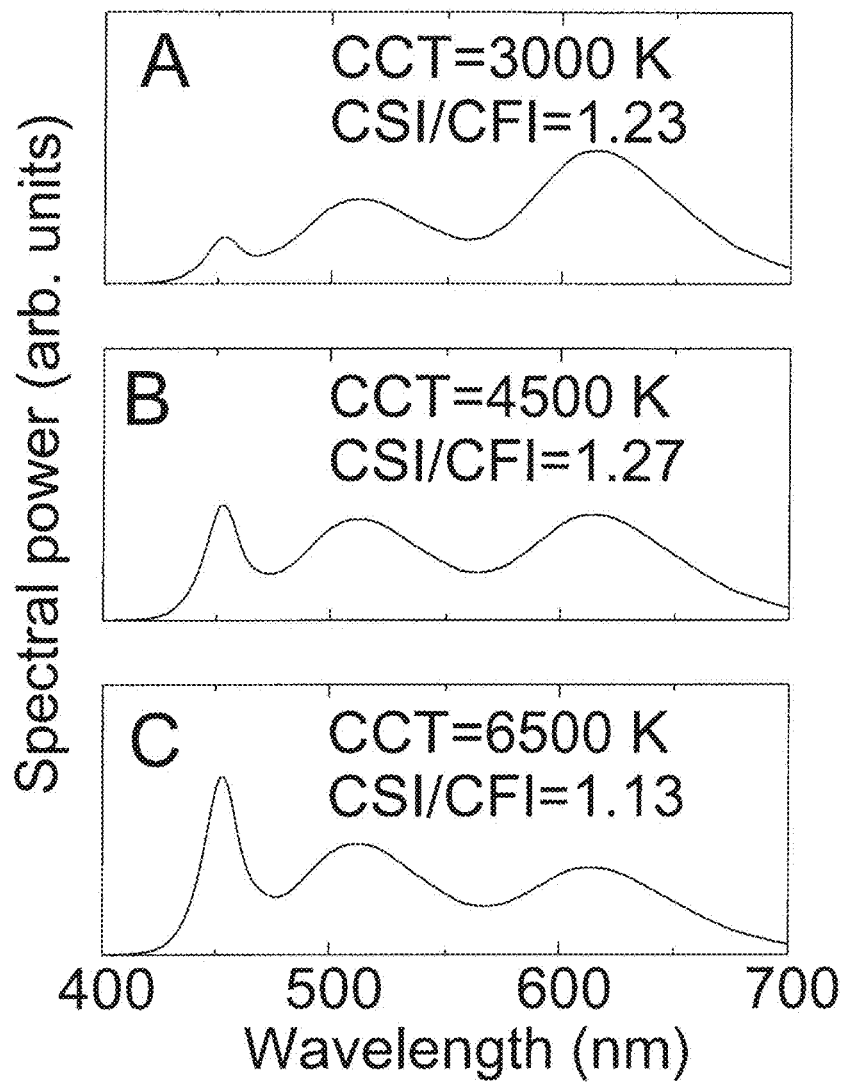
FIG. 8 displays examples of the SPDs of the partial-conversion solid-state light sources for preferential colour rendition. The sources comprise a blue InGaN light-emitting semiconductor chip with a peak wavelength of about 453 nm, a cyan phosphor $Sr_3Si_{13}Al_3O_2N_{21}:Eu^{2+}$ with a peak wavelength of about 511 nm, and a red phosphor $SrS:Eu^{2+}$ with a peak wavelength of about 619 nm. The SPDs are shown for CCTs of 3000 K (Part A), 4500 K (Part B), and 6500 K (Part C).

FIG. 8 displays the SPDs of the partial-conversion solid-state light source for preferential colour rendition provided by the preferred embodiment of the first mode of the second aspect of the present invention. The source comprises a blue InGaN light-emitting semiconductor chip with a peak wavelength of about 453 nm, a cyan phosphor $Sr_3Si_{13}Al_3O_2N_{21}:Eu^{2+}$ with a peak wavelength of about 511 nm, and a red phosphor $SrS:Eu^{2+}$ with a peak wavelength of about 619 nm. Parts A, B, and C of FIG. 8 show the SPDs for standard CCTs of 3000 K, 4500 K, and 6500 K. A common feature of these SPDs is a gap with reduced spectral power in the region between the cyan (511 nm) and red (619 nm) peaks.

In more specific embodiments of the second preferred mode of the second aspect of the invention, solid-state sources of light for preferential colour rendition comprise a light-emitting semiconductor chip emitting violet or near-UV light with a peak wavelength in the range of about 360-420 nm that is completely converted in a wavelength converter containing three phosphors. A part of the violet or near-UV light is converted to blue light with a peak wavelength in the range of about 445-465 nm using inorganic phosphors selected from the groups of compounds including but not limited to $Eu^{2+}$ activated magnesium orthosilicates with general formulae $(Ca,Sr,Ba)MgSiO_4$, $(Ca,Sr,Ba)_3Mg(SiO_4)_2$, and $Ba_2CaMg_2Si_6O_{17}$, inosilicates with a general formula $(Ca,Sr,Ba)SiO_3$, magnesium inosilicates with a general formula $(Ca,Sr,Ba)Mg_2(SiO_3)_3$, and magnesium sorosilicates with a general formula $(Ca,Sr,Ba)MgSiO_7$; $Eu^{2+}$ activated phosphates with a general formula $(Li,K,Na)(Ca,Sr,Ba)PO_4$, magnesium phosphates with a general formula $(Li,K,Na)(Ca,Sr,Ba)_9Mg(PO_4)_7$, and halophosphates with a general formula $(Mg,Ca,Sr,Ba)_{10}(PO_4)_6(F,Cl)_2$; $Eu^{2+}$ activated borates $SrB_2O_4$ and $SrMgB_6O_{11}$; and $Eu^{2+}$ activated magnesium aluminates with general formulae $(Ba,Sr)MgAl_{10}O_{17}$, $(Ba,Sr)MgAl_{14}O_{23}$, $(Ba,Sr)Mg_2Al_{16}O_{27}$, and $(Ba,Sr)_5Mg_6Al_{55}O_{94}$. Another part of the violet or near-UV light is converted to cyan light with a peak wavelength in the range of about 500-520 nm using inorganic phosphors selected from the groups of compounds including but not limited to $Eu^{2+}$ activated orthosilicates with a general formula $(Ca,Sr,Ba)_2SiO_4$, magnesium orthosilicates with a general formula $(Ca,Sr,Ba)_7Mg(SiO_4)_4$, magnesium haloorthosilicates with a general formula $(Ca,Sr,Ba)_8Mg(SiO_4)_4(Cl,F)_2$, scandium orthosilicates with a general formula $(Ca,Sr,Ba)_9Sc_2(SiO_4)_6$, inosilicates with a general formula $(Ca,Sr,Ba)SiO_3$, and strontium halosorosilicates with a general formula $(Ca,Sr,Ba)_6Sr_4(Si_2O_7)_3(Cl,F)_2$; $Eu^{2+}$ activated orthophosphates with general formulae $(Ca,Sr,Ba)_2PO_4$ and $(K,Na)(Ca,Sr,Ba)PO_4$ and orthohalophosphates with a general formula $(K,Na)_5(Ca,Sr,Ba)_4(PO_4)_4(Cl,F)$; $Eu^{2+}$ activated lutetium borates with a general formula $(Ca,Sr,Ba)_2Lu(BO_3)_2$; $Eu^{2+}$ activated silicon oxynitrides with a general formula $(Ca,Sr,Ba)Si_2O_2N_2$, silicon aluminium oxynitrides with general formulae $(Ca,Sr,Ba)_2Si_3AlN_5O_2$ and $(Ca,Sr,Ba)_2Al_3Si_{13}O_2N_{21}$; and $Mn^{2+}$ activated gallates with general formulae $(Ca,Sr,Ba,Mg,La)Ga_{12}O_{19}$ and $(Na,K,Rb)Ga_{11}O_{17}$. The rest part of the violet or near-UV light is converted to red light with a peak wavelength in the range of about 600-620 nm using inorganic phosphors selected from the groups of compounds including but not limited to $Eu^{2+}$ or $Mn^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$ and magnesium borates with a general formula $(Ca,Sr,Ba)_2Mg(BO_3)_2$; $Eu^{2+}$ activated silicon nitrides with general formulae $(Ca,Sr,Ba)_2Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{5-x}O_x$; and $Ce^{3+}$ activated silicon nitrides with a general formula $(Ca,Sr,Ba)SiN_2$. The partial radiant flux of each phosphor is set by adjusting the concentration and size of the phosphor particles in the converter, the size and/or shape of the converter, and the distance of the converter from the electroluminescent chip.

Examples of SPDs that can be used in embodiments of the second preferred mode of the second aspect of the invention were simulated for the blue component of the SPDs provided by either $BaMgAl_{10}O_{17}:Eu^{2+}$ (BAM) or $Sr_3MgSi_2O_8:Eu^{2+}$ phosphor, the cyan component provided by either $Ca_8Mg(SiO_4)_4Cl_2:Eu^{2+}$ or $(Sr_{0.13}Ba_{0.87})_2SiO_4:Eu^{2+}$ phosphor and the red component provided by $Sr_2Si_5N_8:Eu^{2+}$ phosphor. Table 4 shows the parameters of the resulting four sets of emitters for standard CCTs of 3000 K, 4500 K, and 6500 K. The selected phosphors arranged into four sets are seen to provide SPDs with the CSI to CFI ratio in the range of 0.74 to 2.17 depending on a phosphor set and CCT.

TABLE 4

| CCT (K) | CFI (%) | CSI (%) | CDI (%) | CSI/CFI | LER (lm/W) | $R_a$ | CQS $Q_p$ | B1* 448 | B2* 454 | C1* 513 | C2* 519 | R* 617 |
|---|---|---|---|---|---|---|---|---|---|---|---|---|
| 3000 | 33 | 43 | 3 | 1.34 | 272 | 81 | 85 | — | 0.074 | 0.270 | — | 0.656 |
|  | 45 | 34 | 2 | 0.74 | 279 | 87 | 90 | — | 0.090 | — | 0.263 | 0.647 |
|  | 33 | 43 | 2 | 1.30 | 270 | 81 | 84 | 0.087 | — | 0.263 | — | 0.650 |
|  | 46 | 33 | 2 | 0.72 | 276 | 88 | 88 | 0.104 | — | — | 0.256 | 0.640 |
| 4500 | 27 | 52 | 1 | 1.93 | 266 | 78 | 89 | — | 0.167 | 0.315 | — | 0.518 |
|  | 42 | 42 | 0 | 1.00 | 274 | 86 | 94 | — | 0.187 | — | 0.309 | 0.504 |
|  | 29 | 52 | 0 | 1.84 | 261 | 79 | 88 | 0.193 | — | 0.299 | — | 0.508 |
|  | 43 | 42 | 0 | 0.98 | 268 | 86 | 93 | 0.216 | — | — | 0.291 | 0.493 |
| 6500 | 24 | 53 | 0 | 2.17 | 256 | 79 | 89 | — | 0.245 | 0.331 | — | 0.424 |
|  | 42 | 40 | 0 | 0.97 | 264 | 86 | 95 | — | 0.269 | — | 0.325 | 0.406 |
|  | 26 | 53 | 0 | 2.07 | 250 | 79 | 89 | 0.281 | — | 0.308 | — | 0.411 |
|  | 42 | 42 | 0 | 1.00 | 256 | 86 | 94 | 0.306 | — | — | 0.300 | 0.394 |

*Notations:
B1 is $BaMgAl_{10}O_{17}:Eu^{2+}$ (BAM) phosphor;
B2 is $Sr_3MgSi_2O_8:Eu^{2+}$ phosphor;
C1 is $Ca_8Mg(SiO_4)_4Cl_2:Eu^{2+}$ phosphor;
C2 is $(Sr_{0.13}Ba_{0.87})_2SiO_4:Eu^{2+}$ phosphor;
R is $Sr_2Si_5N_8:Eu^{2+}$ phosphor.

In the preferred embodiment of the second mode of the second aspect of the present invention, the solid-state light source for preferential colour rendition is a complete-conversion source that comprises a near-UV InGaN light-emitting semiconductor chip with a peak wavelength of 380 nm, a blue phosphor $BaMgAl_{10}O_{17}:Eu^{2+}$ (BAM) with a peak wavelength of about 448 nm, a cyan phosphor $(Sr_{0.13}Ba_{0.87})_2SiO_4:Eu^{2+}$ with a peak wavelength of about 519 nm, and a red phosphor $Sr_2Si_5N_8:Eu^{2+}$ with a peak wavelength of about 617 nm, wherein for more than 1200 different test colour samples, the fractions of the samples that are rendered with high fidelity, increased saturation, and decreased saturation are set (bold numbers in Table 4):

(a) to about 46%, about 33%, and about 2%, respectively, for a CCT of 3000 K, by selecting the RPRFs of 0.104, 0.256, and 0.640 escaping from said 448-nm, 519-nm and 617-nm phosphors, respectively; or (b) to about 43%, about 42%, and about 2%, respectively, for a CCT of 4500 K, by selecting the RPRFs of 0.216, 0.291, and 0.493 escaping from said 448-nm, 519-nm and 617-nm phosphors, respectively; or (c) to about 42%, about 42%, and about 2%, respectively, for a CCT of 6500 K, by selecting the RPRFs of 0.306, 0.300, and 0.394 escaping from said 448-nm, 519-nm and 617-nm phosphors, respectively.

Figure 9:
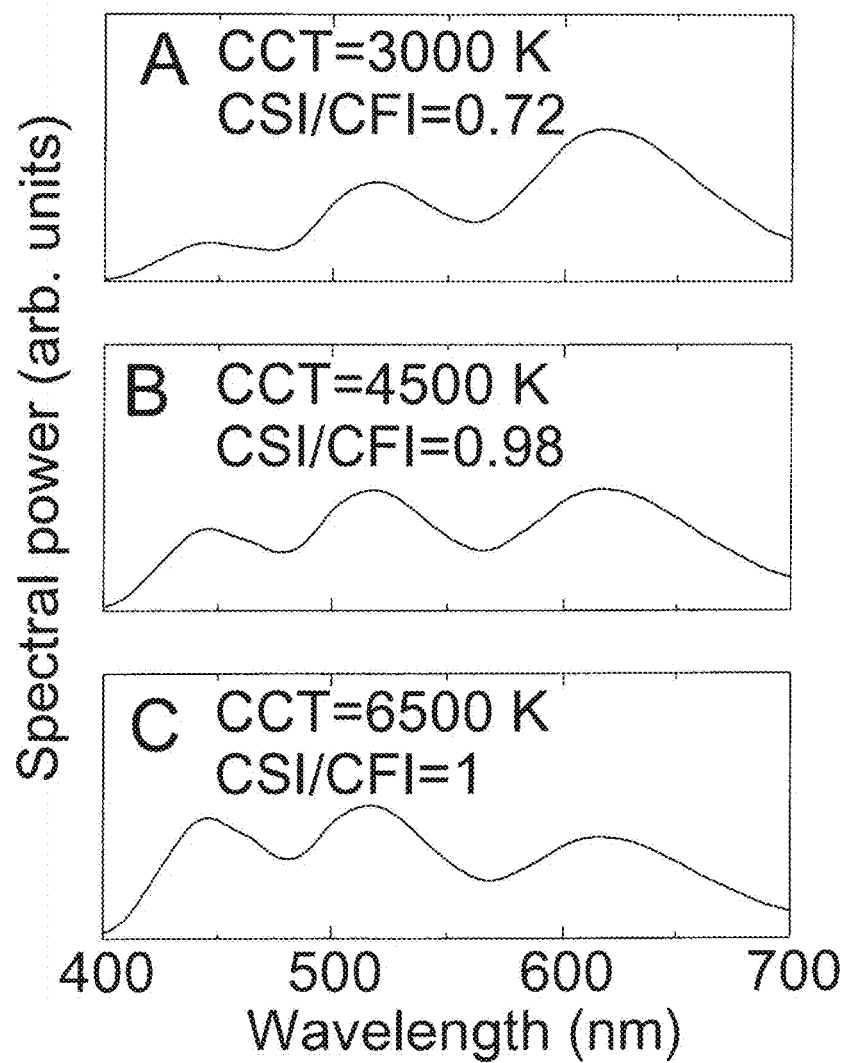
FIG. 9 displays examples of the SPDs of the complete-conversion solid-state light sources for preferential colour rendition. The sources comprise a near-UV InGaN light-emitting semiconductor chip with a peak wavelength of 380 nm, a blue phosphor $BaMgAl_{10}O_{17}:Eu^{2+}$ (BAM) with a peak wavelength of about 478 nm, a cyan phosphor $(Sr_{0.13}Ba_{0.87})_2SiO_4:Eu^{2+}$ with a peak wavelength of about 519 nm, and a red phosphor $Sr_2Si_5N_8:Eu^{2+}$ with a peak wavelength of about 617 nm. The SPDs are shown for CCTs of 3000 K (Part A), 4500 K (Part B), and 6500 K (Part C).

FIG. 9 displays the SPDs of the complete-conversion solid-state light source for preferential colour rendition provided by the preferred embodiment of the second mode of the second aspect of the present invention. The source comprises a near-UV InGaN light-emitting semiconductor chip with a peak wavelength of 380 nm, a blue phosphor $BaMgAl_{10}O_{17}:Eu^{2+}$ (BAM) with a peak wavelength of about 448 nm, a cyan phosphor $(Sr_{0.13}Ba_{0.87})_2SiO_4:Eu^{2+}$ with a peak wavelength of about 519 nm, and a red phosphor $Sr_2Si_5N_8:Eu^{2+}$ with a peak wavelength of about 617 nm. Parts A, B, and C of FIG. 8 show the SPDs for standard CCTs of 3000 K, 4500 K, and 6500 K. A common feature of these SPDs is a gap with reduced spectral power in the region between the cyan (519 nm) and red (617 nm) peaks.

Further objects and advantages are to provide a design for the solid-state white light sources for meeting subjective preferences to colour rendition. Embodiments of the present invention may involve additional components such as, for instance, (a) an electronic circuit for dimming the light source in such a way that the RPRFs generated by each group of emitters are maintained at constant values; and/or (b) an electronic and/or optoelectronic circuit for estimating the RPRFs generated by each group of emitters; and/or (c) a computer hardware and software for the control of the electronic circuits in such a way that allows varying CCT, maintaining a constant luminous output while compensating thermal and aging drifts of each group of light emitters.

Polychromatic sources of white light with controlled colour saturating ability designed in accordance with the teachings of aspects and of the present invention can be used in general lighting applications where they can meet subjective needs and preferences of colour vision in educational, manufacturing, medical, architectural, retail, office, residence, street, transport, recreation, sports, entertainment, and landscape lighting for highlighting colours of various surfaces, as well as in other colour-preference sensitive applications, such as for filming, photography, digital imaging and design.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual skilled in the art are included within the scope of the invention as defined by the accompanying claims. For example, similar white light sources can be provided using organic LEDs or lasers and organic or semiconductor quantum dot phosphors, with particular ratios of the number of colours rendered with high fidelity and the number of colours rendered with increased chromatic saturation.

The invention claimed is:

1. A method for obtaining illumination with preferential colour rendition using a light source comprising at least three solid-state electroluminescent and/or photoluminescent emitters, each emitter having an individual spectral power distribution and relative partial radiant flux selected by computational searching with the net spectral power distribution of said light source, wherein the computational searching is constrained by the condition that for more than fifteen different test colour samples illuminated by said light source, the colour shifts of the samples computed in respect of a reference light source are such that a) the ratio of the fraction of the test colour samples that are rendered with increased saturation to the fraction of the test colour samples that are rendered with high fidelity within the range of 0.3 to 3 and b) the fraction of the test colour samples that are rendered with decreased saturation of less than 10%.

2. The method of claim 1, which uses a source of a white light with a correlated colour temperature set in the range of around 2000 to 20000 K for illuminating the different colour samples, and a reference light source having a correlated colour temperature equal to that of said solid-state light source, where the reference light source is a blackbody illuminant, for correlated colour temperatures below 5000 K, or daylight-phase illuminant, for correlated colour temperatures above 5000 K.

3. The method of claim 1, which uses test colour samples having reflectivity spectra that are identical to those of the samples selected out of a set of over 200 different Munsell samples.

4. The method of claim 1, wherein colour distortions of the illuminated test colour samples are evaluated by replacing a reference light source by a solid-state source of light and computing the resulting colour shift in respect of the MacAdam ellipses where the MacAdam ellipses are determined experimentally or obtained using a nonlinear interpolation of the experimental data.

5. The method of claim 4, which comprises
    defining the colour of a test colour sample rendered with high fidelity as that with the colour shift vector residing within the 3-step MacAdam ellipse,
    defining the colour of a test colour sample rendered with increased saturation as that with the colour shift vector stretched out of the 3-step MacAdam ellipse and having a positive projection on the saturation direction larger than the size of the ellipse, and
    defining the colour of a test colour sample rendered with decreased saturation as that with the colour shift vector stretched out of the 3-step MacAdam ellipse and having a negative projection on the saturation direction larger than the size of the ellipse,
    estimating the colour shift vectors with chromatic adaptation of human vision taken into account when the chromaticity of said solid-state source of light does not exactly match the chromaticity of the reference illuminant.

6. The method of claim 5, which uses at least one cluster of at least four groups of independently electrically driven visible-light emitters having different spectral power distributions with peak wavelengths as a light source, and uses an electronic circuit for the control of the average driving current of each group of emitters and/or the number of the emitters lit on within a group, and a component for uniformly distributing radiation from the different groups of emitters over an illuminated object,
    where said groups of the visible-light emitters for illumination within at least one light-emitting diode package which emits light due to one of the methods, selected from injection electroluminescence in semiconductor junctions, partial or complete conversion of injection electroluminescence in wavelength converters containing phosphors, and where the light-emitting diodes within the four different groups emitting blue, cyan-green, green-yellow, and red light with peak wavelengths, residing within the intervals of
  (a) about 400-475 nm, 480-540 nm, 540-610 nm, and 610-650 nm for a correlated colour temperature of 3000 K and a luminous efficacy of radiation of at least of 310 lm/W; or
  (b) about 425-465 nm, 490-530 nm, 540-610 nm, and 610-650 nm for a correlated colour temperature of 4500 K and a luminous efficacy of radiation of at least of 280 lm/W; or
  (c) about 430-465 nm, 500-525 nm, 540-605 nm, and 610-650 nm for a correlated colour temperature of 6500 K and a luminous efficacy of radiation of at least of 250 lm/W,
  wherein the partial radiant fluxes of each group of light-emitting diodes are adjusted by controlling the average driving current for each group of light-emitting diodes.

7. The method of claim 6, which uses a group of blue electroluminescent InGaN light-emitting diodes with a peak wavelength of about 453 nm, a group of green electroluminescent InGaN light-emitting diodes with a peak wavelength of about 522 nm, a group of amber phosphor converted InGaN light-emitting diodes with a peak wavelength of about 593 nm, and a group of red electroluminescent AlGaInP light-emitting diodes with a peak wavelength of about 623 nm, for illumination and the fractions of the samples that are rendered with high fidelity, increased saturation, and decreased saturation for more than 1200 different test colour samples are set:
  (a) to about 42%, about 42%, and about 2%, respectively, for a correlated colour temperature of 3000 K, by selecting the relative partial radiant fluxes of 0.094, 0.265, 0.362, and 0.279 generated by said groups of 453-nm, 522-nm, 593-nm, and 623-nm light-emitting diodes, respectively; or
  (b) to about 42%, about 40%, and about 1%, respectively, for a correlated colour temperature of 4500 K, by selecting the relative partial radiant fluxes of 0.193, 0.312, 0.304, and 0.191 generated by said groups of 453-nm, 522-nm, 593-nm, and 623-nm light-emitting diodes, respectively; or
  (c) to about 37%, about 39%, and about 1%, respectively, for a correlated colour temperature of 6500 K, by selecting the relative partial radiant fluxes of 0.271, 0.335, 0.242, and 0.152 generated by said groups of 453-nm, 522-nm, 593-nm, and 623-nm light-emitting diodes, respectively.

8. The method of claim 5, which uses at least one electrically driven light emitter for illumination with at least one package and at least one wavelength converter, within or outside the package, emitting at least two spectral components with different spectral power distributions with peak wavelengths, and a component for uniformly distributing visible radiation from the different emitters and converters over an illuminated object.

9. The method of claim 8, which uses electrically driven emitters for illumination where said emitters comprise light-emitting diode semiconductor chips, which emit light due to one of the methods, selected from injection electroluminescence in semiconductor junctions and partial or complete conversion of injection electroluminescence in wavelength converters containing phosphors.

10. The method of claim 9, which uses a light-emitting semiconductor chip emitting blue light with a peak wavelength in the range of about 445-465 nm that is partially converted in a wavelength converter containing two phosphors that emit cyan light with a peak wavelength in the range of about 500-520 nm and red light with a peak wavelength in the range of about 600-620 nm, respectively, wherein the partial radiant flux of each phosphor is being set by adjusting the concentration and size of the phosphor particles in the converter, the size and/or shape of the converter, and the distance of the converter from the electroluminescent chip.

11. The method of claim 10, which comprises
  (a) converting the blue light to cyan light using inorganic phosphors being selected from the group of compounds, comprising $Eu^{2+}$ activated magnesium haloorthosilicates with a general formula $(Ca,Sr,Ba)_8Mg(SiO_4)_4(Cl,F)_2$ and scandium orthosilicates with a general formula $(Ca,Sr,Ba)_9Sc_2(SiO_4)_6$; $Eu^{2+}$ activated silicon oxynitrides with a general formula $(Ca,Sr,Ba)Si_2O_2N_2$ and silicon aluminium oxynitrides with a general formula $(Ca,Sr,Ba)_3Si_{13}Al_3O_2N_{21}$; and $Mn^{2+}$ activated aluminates with general formulae $(Ca,Sr,Ba,Mg)Al_{10}O_{17}$ and $(Sc,Y,La)Al_{11}O_{18}$; and
  (b) converting the blue to red light using inorganic phosphors being selected from the group of compounds, comprising $Eu^{2+}$ activated chalcogenides with a general formula $(Ca,Sr)(S,Se)$, $Eu^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$; $Eu^{2+}$ activated silicon nitrides with general formulae $(Ca,Sr,Ba)_2Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{8-x}O_x$; and $Ce^{3+}$ activated silicon nitrides with a general formula $(Ca,Sr,Ba)SiN_2$.

12. The method of claim 11, which uses a blue InGaN light-emitting semiconductor chip with a peak wavelength of about 453 nm, a cyan phosphor $Sr_3Si_{13}Al_3O_2N_{21}:Eu^2$ with a peak wavelength of about 511 nm, and a red phosphor $SrS:Eu^2$ with a peak wavelength of about 619 nm, and the fractions of the samples that are rendered with high fidelity, increased saturation, and decreased saturation for more than 1200 different test colour samples are set:
  (a) to about 33%, about 40%, and about 5%, respectively, for a correlated colour temperature of 3000 K, by selecting the relative partial radiant fluxes of 0.046, 0.309, and 0.645 escaping from said 453-nm chip without conversion and from said 511-nm and 619-nm phosphors, respectively; or
  (b) to about 34%, about 44%, and about 1%, respectively, for a correlated colour temperature of 4500 K, by selecting the relative partial radiant fluxes of 0.142, 0.434, and 0.424 escaping from said 453-nm chip without conversion and from said 511-nm and 619-nm phosphors, respectively; or
  (c) to about 38%, about 43%, and about 1%, for a correlated colour temperature of 6500 K, by selecting the relative partial radiant fluxes of 0.215, 0.457, and 0.328 escaping from said 453-nm chip without conversion and said from 511-nm and 619-nm phosphors, respectively.

13. The method of claim 9, which uses the light-emitting semiconductor chip emitting violet or near-UV light with a peak wavelength in the range of 360-420 nm that is completely converted in a wavelength converter containing three phosphors that emit blue light with a peak wavelength in the range of about 445-465 nm, cyan light with a peak wavelength in the range of about 500-520 nm, and red light with a peak wavelength in the range of about 600-620 nm, respectively, wherein the partial radiant flux of each phosphor is being set by adjusting the concentration and size of the phosphor particles in the converter, the size and/or shape of the converter, and the distance of the converter from the electroluminescent chip.

14. The method of claim 13, which comprises
(a) converting the violet or near-UV light to blue light using inorganic phosphors being selected from the groups of compounds, comprising $Eu^{2+}$ activated magnesium orthosilicates with general formulae $(Ca,Sr,Ba)MgSiO_4$, $(Ca,Sr,Ba)_3Mg(SiO_4)_2$, and $Ba_2CaMg_2Si_6O_{17}$, inosilicates with a general formula $(Ca,Sr,Ba)SiO_3$, magnesium inosilicates with a general formula $(Ca,Sr,Ba)Mg_2(SiO_3)_3$, and magnesium sorosilicates with a general formula $(Ca,Sr,Ba)MgSiO_7$; $Eu^{2+}$ activated phosphates with a general formula $(Li,K,Na)(Ca,Sr,Ba)PO_4$, magnesium phosphates with a general formula $(Li,K,Na)(Ca,Sr,Ba)_9Mg(PO_4)_7$, and halophosphates with a general formula $(Mg,Ca,Sr,Ba)_{10}(PO_4)_6(F,Cl)_2$; $Eu^{2+}$ activated borates $SrB_2O_4$ and $SrMgB_6O_{11}$; and $Eu^{2+}$ activated magnesium aluminates with general formulae $(Ba,Sr)MgAl_{10}O_{17}$, $(Ba,Sr)MgAl_{14}O_{23}$, $(Ba,Sr)Mg_2Al_{16}O_{27}$, and $(Ba,Sr)_5Mg_6Al_{55}O_{94}$; and
(b) converting the violet or near-UV light to cyan light using inorganic phosphors being selected from the group of compounds, comprising $Eu^{2+}$ activated orthosilicates with a general formula $(Ca,Sr,Ba)_2SiO_4$, magnesium orthosilicates with a general formula $(Ca,Sr,Ba)_7Mg(SiO_4)_4$, magnesium haloorthosilicates with a general formula $(Ca,Sr,Ba)_8Mg(SiO_4)_4(Cl,F)_2$, scandium orthosilicates with a general formula $(Ca,Sr,Ba)_9Sc_2(SiO_4)_6$, inosilicates with a general formula $(Ca,Sr,Ba)SiO_3$, and strontium halosorosilicates with a general formula $(Ca,Sr,Ba)_6Sr_4(Si_2O_7)_3(Cl,F)_2$; $Eu^{2+}$ activated orthophosphates with general formulae $(Ca,Sr,Ba)_2PO_4$ and $(K,Na)(Ca,Sr,Ba)PO_4$ and orthohalophosphates with a general formula $(K,Na)_5(Ca,Sr,Ba)_4(PO_4)_4(Cl,F)$; $Eu^{2+}$ activated lutetium borates with a general formula $(Ca,Sr,Ba)_2Lu(BO_3)_2$; $Eu^{2+}$ activated silicon oxynitrides with a general formula $(Ca,Sr,Ba)Si_2O_2N_2$, silicon aluminium oxynitrides with general formulae $(Ca,Sr,Ba)_2Si_2AlN_5O_2$ and $(Ca,Sr,Ba)_2Al_3Si_{13}O_2N_{21}$; and $Mn^{2+}$ activated gallates with general formulae $(Ca,Sr,Ba,Mg,La)Ga_{12}O_{19}$ and $(Na,K,Rb)Ga_{11}O_{17}$; and
(c) converting the violet or near-UV light to red light using inorganic phosphors being selected from the group of compounds, comprising $Eu^{2+}$ or $Mn^{2+}$ activated $Ba_2ZnS_3$; $Eu^{2+}$ activated sorosilicates $(Ca,Sr,Ba)_3Si_2O_7$; $Eu^{2+}$ activated borates with a general formula $(Li,K)_2Lu(BO_3)_2$ and magnesium borates with a general formula $(Ca,Sr,Ba)_2Mg(BO_3)_2$; $Eu^{2+}$ activated silicon nitrides with general formulae $(Ca,Sr,Ba)_2Si_5N_8$ and $(Ca,Sr,Ba)SiN_2$, silicon aluminium nitrides with a general formula $(Ca,Sr,Ba)AlSiN_3:Eu^{2+}$, and silicon aluminium oxynitrides with a general formula $(Ca,Sr,Ba)_3Si_{5-x}Al_xN_{8-x}O_x$; and $Ce^{3+}$ activated silicon nitrides with a general formula $(Ca,Sr,Ba)SiN_2$.

15. The method of claim 14, which uses a near-UV InGaN light-emitting semiconductor chip with a peak wavelength of 380 nm, a blue phosphor $BaMgAl_{10}O_{17}:Eu^{2+}$ (BAM) with a peak wavelength of about 448 nm, a cyan phosphor $(Sr_{0.13}Ba_{0.87})_2SiO_4:Eu^{2+}$ with a peak wavelength of about 519 nm, and a red phosphor $Sr Si_5N_8:Eu^{2+}$ with a peak wavelength of about 617 nm, and the fractions of the samples that are rendered with high fidelity, increased saturation, and decreased saturation for more than 1200 different test colour samples are set:
(a) to about 46%, about 33%, and about 2%, respectively, for a correlated colour temperature of 3000 K, by selecting the relative partial radiant fluxes of 0.104, 0.256, and 0.640 escaping from said 448-nm, 519-nm and 617-nm phosphors, respectively; or
(b) to about 43%, about 42%, and about 0%, respectively, for a correlated colour temperature of 4500 K, by selecting the relative partial radiant fluxes of 0.216, 0.291, and 0.493 escaping from said 448-nm, 519-nm and 617-nm phosphors, respectively; or
(c) to about 42%, about 42%, and about 0%, respectively, for a correlated colour temperature of 6500 K, by selecting the relative partial radiant fluxes of 0.306, 0.300, and 0.394 escaping from said 448-nm, 519-nm and 617-nm phosphors, respectively.

16. The method of claim 1 wherein:
said light source is dimmed using an electronic circuit in such a way that the relative partial radiant fluxes of each spectral component of said light source are maintained at constant values; and/or
the relative partial radiant fluxes of each spectral component of said light source are estimated by using an electronic and/or optoelectronic circuit; and/or
the electronic circuits are controlled by a computer hardware and software in such a way that allows compensating thermal and aging drifts of each spectral component of said light source.

\* \* \* \* \*